US012627912B2

(12) United States Patent
Baek et al.

(10) Patent No.: US 12,627,912 B2
(45) Date of Patent: May 12, 2026

(54) ELECTRONIC DEVICE INCLUDING INSULATING STRUCTURE FOR SPEAKER

(71) Applicant: Samsung Electronics Co., Ltd., Suwon-si (KR)

(72) Inventors: Incheol Baek, Suwon-si (KR); Jungsik Park, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 77 days.

(21) Appl. No.: 18/365,434

(22) Filed: Aug. 4, 2023

(65) Prior Publication Data

US 2024/0155274 A1 May 9, 2024

Related U.S. Application Data

(63) Continuation of application No. PCT/KR2023/010694, filed on Jul. 24, 2023.

(30) Foreign Application Priority Data

Nov. 9, 2022 (KR) ........................ 10-2022-0149087
Dec. 12, 2022 (KR) ........................ 10-2022-0173159

(51) Int. Cl.
H04R 1/02 (2006.01)
H05K 7/20 (2006.01)

(52) U.S. Cl.
CPC ............. H04R 1/02 (2013.01); H05K 7/2039 (2013.01); H04R 2499/11 (2013.01)

(58) Field of Classification Search
CPC .......... H04R 1/02; H04R 1/025; H04R 1/026; H04R 1/028; H04R 2499/11;
(Continued)

(56) References Cited

U.S. PATENT DOCUMENTS 6,765,798 B1    7/2004  Ratliff et al.
6,771,495 B2    8/2004  Fujiwara et al.
(Continued)

FOREIGN PATENT DOCUMENTS

KR    10-2013-0040616    4/2013
KR        10-1330111    11/2013
(Continued)

OTHER PUBLICATIONS

Search Report and Written Opinion dated Nov. 13, 2023 issued in International Patent Application No. PCT/KR2023/010694.
(Continued)

*Primary Examiner* — Ahmad F. Matar
*Assistant Examiner* — Sabrina Diaz
(74) *Attorney, Agent, or Firm* — Nixon & Vanderhye P.C.

(57) ABSTRACT

An electronic device includes: a housing, a speaker, and an enclosure surrounding the speaker, the enclosure including a heat dissipation portion comprising a thermally conductive material facing the speaker and spaced apart from the speaker. The electronic device includes a support disposed between the speaker and the enclosure, the support including a first portion disposed on the speaker, a second portion facing the heat dissipation portion in the enclosure, and a third portion connecting the first portion and the second portion. An area of the first portion may be greater than an area of the second portion.

20 Claims, 9 Drawing Sheets

(58) Field of Classification Search
CPC .. H04R 2499/15; H04R 9/022; H05K 7/2039;
H05K 7/20154; H05K 7/20; H05K
7/20418; H05K 7/20963
USPC ................................. 381/386, 388, 397, 333
See application file for complete search history.

(56) References Cited

U.S. PATENT DOCUMENTS

| | | | |
|---|---|---|---|
| 7,663,883 B2 * | 2/2010 | Shirakami ............. | H01L 23/373 174/15.2 |
| 8,270,170 B2 | 9/2012 | Hughes et al. | |
| 8,682,020 B2 | 3/2014 | Wilk et al. | |
| 10,341,777 B2 | 7/2019 | Dong et al. | |
| 10,854,947 B2 | 12/2020 | Son et al. | |
| 12,016,158 B2 | 6/2024 | Kim et al. | |
| 2014/0301587 A1 | 10/2014 | Ji et al. | |
| 2020/0178415 A1 * | 6/2020 | Kim ................... | H05K 7/20454 |
| 2021/0029457 A1 | 1/2021 | Huang et al. | |

FOREIGN PATENT DOCUMENTS

| | | | |
|---|---|---|---|
| KR | 10-1502269 | 3/2015 | |
| KR | 10-2020-0060117 | 5/2020 | |
| KR | 10-2021-0123510 | 10/2021 | |
| KR | 10-2469449 | 11/2022 | |
| WO | WO-2022208743 A1 * | 10/2022 | .............. H04R 1/00 |

OTHER PUBLICATIONS

Extended European Search Report dated Oct. 28, 2025 issued in European Patent Application No. 23888853.1, 8 pp.
European Communication Pursuant to Article 94(3) EPC dated Mar. 23, 2026 issued in European Patent Application No. 23888853.1, 9 pp.

* cited by examiner

ELECTRONIC DEVICE INCLUDING INSULATING STRUCTURE FOR SPEAKER

CROSS-REFERENCE TO RELATED APPLICATIONS

This application is a continuation of International Application No. PCT/KR2023/010694 designating the United States, filed on Jul. 24, 2023, in the Korean Intellectual Property Receiving Office and claiming priority to Korean Patent Application Nos. 10-2022-0149087, filed on Nov. 9, 2022, in the Korean Intellectual Property Office, and 10-2022-0173159, filed on Dec. 12, 2022, in the Korean Intellectual Property Office, the disclosures of each of which are incorporated by reference herein in their entireties.

BACKGROUND

Field

The present disclosure relates to an electronic device including an insulating structure for a speaker.

Description of Related Art

An electronic device may include a speaker for providing an audio signal to a user. The speaker may be configured to output the audio signal to provide auditory information to the user. Operation of the speaker in the electronic device may cause generation of heat from the speaker.

SUMMARY

According to an embodiment, an electronic device may include a housing including a first surface on which a display is disposed, and a second surface opposite to the first surface. The electronic device may include a speaker configured to output audio, the speaker including a third surface facing the first surface and a fourth surface facing the second surface and including a yoke. The electronic device may include an enclosure including a heat dissipation portion facing the fourth surface of the speaker and spaced apart from the fourth surface, the enclosure being configured to surround at least a portion of the speaker. The electronic device may include a supporting member disposed between the fourth surface of the speaker and the enclosure, the supporting member including a first portion disposed on the fourth surface, a second portion facing the heat dissipation portion, and a third portion connecting the first portion and the second portion. An area of the first portion disposed on the fourth surface is greater than an area of the second portion facing the heat dissipation portion.

According to an embodiment, an electronic device may include: a housing including a first surface and a second surface opposite to the first surface. The electronic device may include a speaker including a third surface facing the first surface, and a fourth surface facing the second surface, the speaker being configured to output audio. The electronic device may include an enclosure including a heat dissipation portion including metal facing the fourth surface of the speaker and spaced apart from the fourth surface, the enclosure being configured to surround at least a portion of the speaker. The electronic device may include a supporting member disposed between the fourth surface of the speaker and the enclosure, the supporting member including a first portion disposed on the fourth surface, a second portion facing the heat dissipation portion, and a third portion connecting the first portion and the second portion. An area of the first portion disposed on the fourth surface is greater than an area of the second portion facing the heat dissipation portion. The third portion of the supporting member may include at least one air gap configured to pass air in the enclosure to reduce heat transferred from the first portion to the second portion.

BRIEF DESCRIPTION OF THE DRAWINGS

The above and other aspects, features and advantages of certain embodiments of the present disclosure will be more apparent from the following detailed description, taken in conjunction with the accompanying drawings.

DETAILED DESCRIPTION

Figure 1:
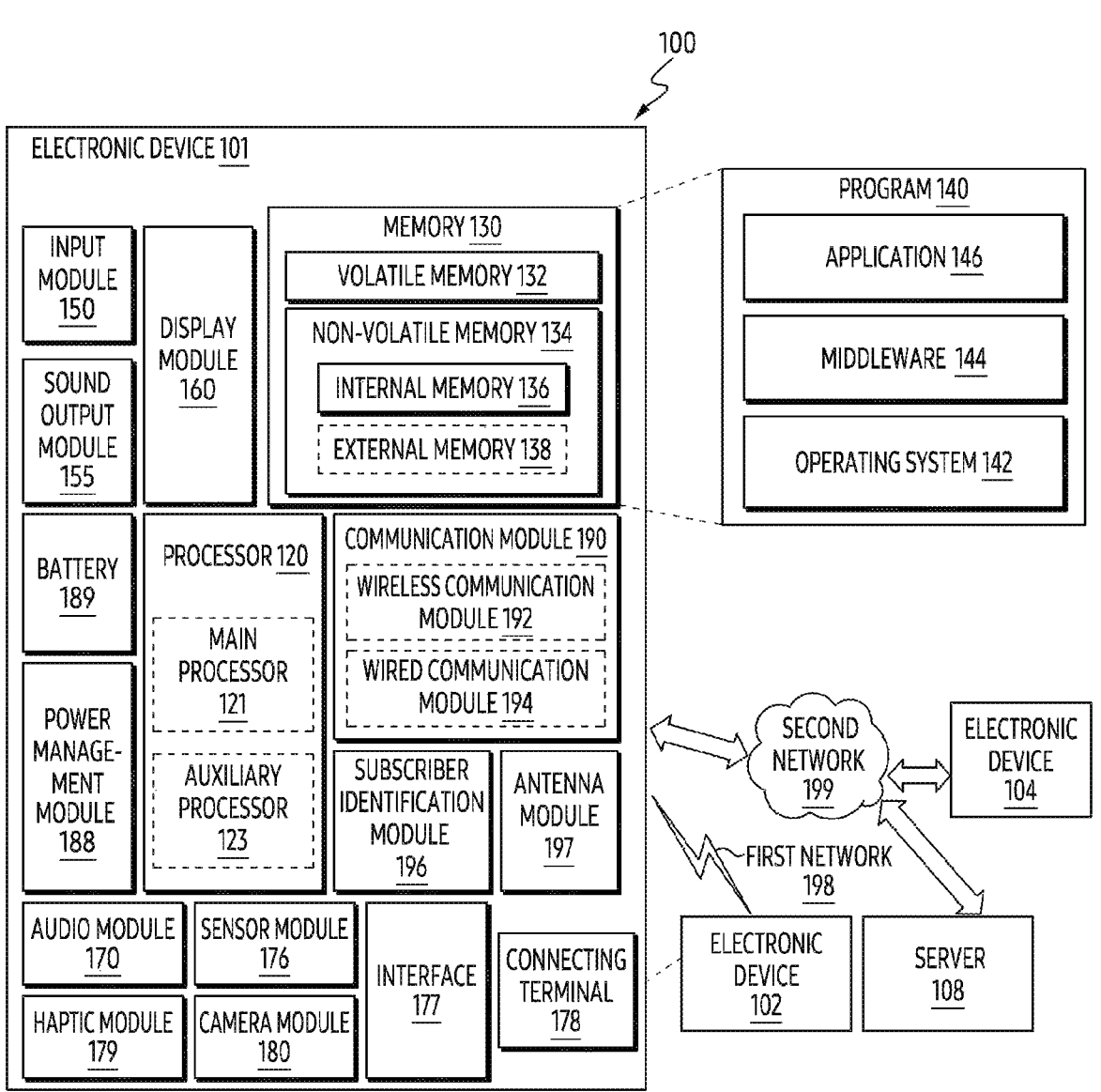
FIG. 1 is a block diagram of an electronic device in a network environment according to an embodiment.

FIG. 1 is a block diagram of an electronic device in a network environment according to an example of the disclosure.

Referring to FIG. 1, an electronic device 101 in a network environment 100 may communicate with an electronic device 102 via a first network 198 (e.g., a short-range wireless communication network), or at least one of an electronic device 104 or a server 108 via a second network 199 (e.g., a long-range wireless communication network). According to an example, the electronic device 101 may communicate with the electronic device 104 via the server 108. According to an example, the electronic device 101 may include a processor 120, a memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to an example, as at least part of the data processing or computation, the processor 120 may store a command or data received from another component (e.g., the sensor module 176 or the communication module 190) in a volatile memory 132, process the command or the data stored in the volatile memory 132, and store resulting data in a non-volatile memory 134. According to an example, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an example, the auxiliary processor 123 (e.g., an image signal processor or a communication processor) may be implemented as part of another component (e.g., the camera module 180 or the communication module 190) functionally related to the auxiliary processor 123. According to an example, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an example, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an example, the display module 160 may include a touch sensor adapted to detect a touch, or a pressure sensor adapted to measure the intensity of force incurred by the touch.

The audio module 170 may convert a sound into an electrical signal and vice versa. According to an example, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an example, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an example, the interface 177 may include, for example, a high-definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an example, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an example, the haptic module 179 may include, for example, a motor, a piezoelectric element, or an electric stimulator.

The camera module 180 may capture a still image or moving images. According to an example, the camera module 180 may include one or more lenses, image sensors, image signal processors, or flashes.

The power management module 188 may manage power supplied to the electronic device 101. According to an example, the power management module 188 may be implemented as at least part of, for example, a power management integrated circuit (PMIC).

The battery 189 may supply power to at least one component of the electronic device 101. According to an example, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an example, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mm Wave band) to address, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large-scale antenna. The wireless communication module 192 may support various requirements specified in the electronic device 101, an external electronic device (e.g., the electronic device 104), or a network system (e.g., the second network 199). According to an example, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an example, the antenna module 197 may include an antenna including a radiating element including a conductive material or a conductive pattern formed in or on a substrate (e.g., a printed circuit board (PCB)). According to an example, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an example, another component (e.g., a radio frequency integrated circuit (RFIC)) other than the radiating element may be additionally formed as part of the antenna module 197.

According to various embodiments, the antenna module 197 may form a mmWave antenna module. According to an example, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an example, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an example, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra-low-latency services using, e.g., distributed computing or mobile edge computing. In another example of the disclosure, the external electronic device 104 may include an internet-of-things (IoT) device. The server 108 may be an intelligent server using machine learning and/or a neural network. According to an example, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 2:
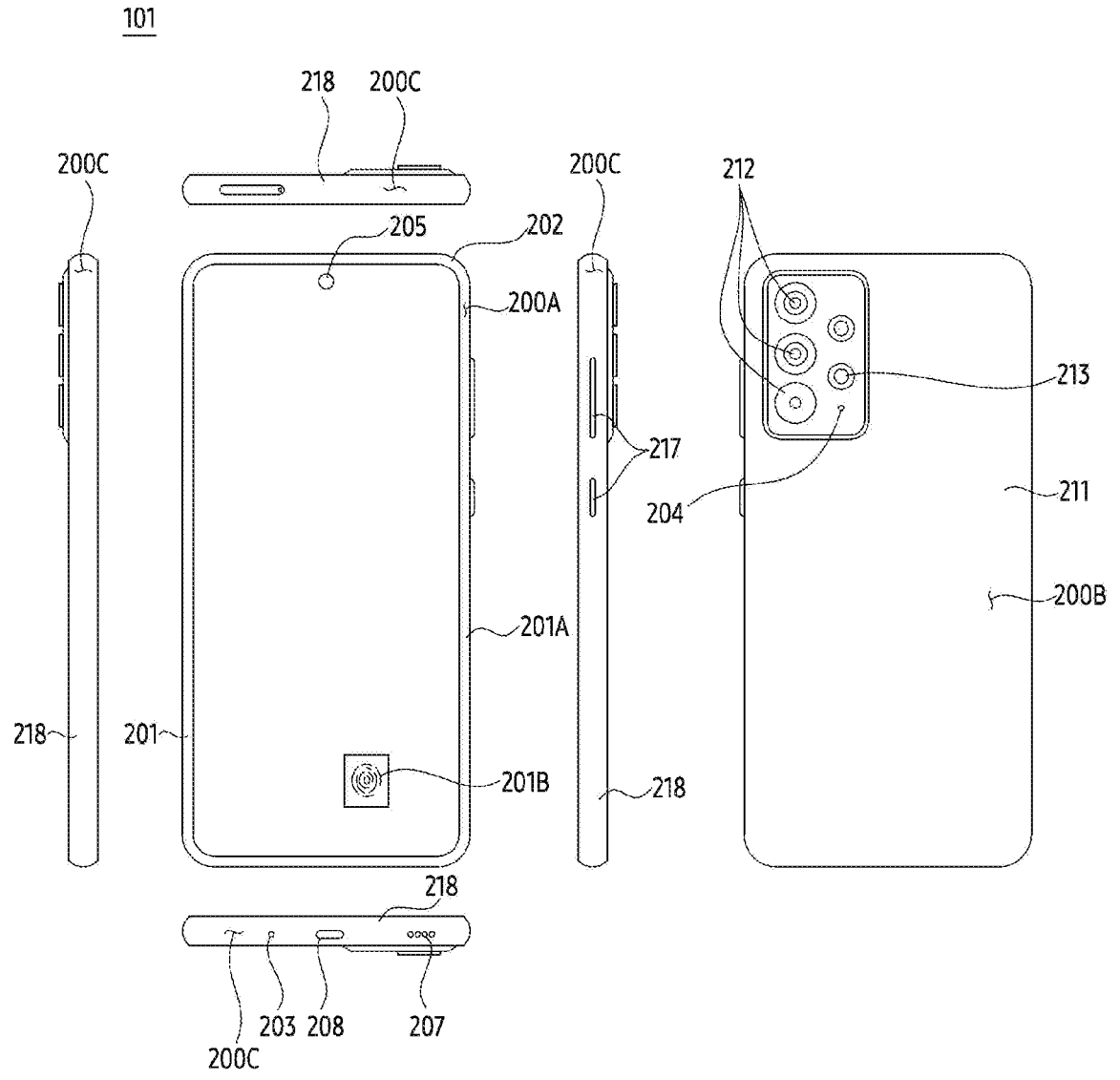
FIG. 2 is a diagram illustrating an electronic device according to an embodiment.

FIG. 2 is a diagram illustrating an electronic device according to an embodiment.

Referring to FIG. 2, an electronic device 101 according to an embodiment may include a housing 210 forming an exterior of the electronic device 101. For example, the housing 210 may include a first surface 200A, a second surface 200B, and a side surface 200C surrounding a space between the first surface 200A and the second surface 200B. According to an embodiment, the housing 210 may refer to a structure forming at least a portion of the first surface 200A, the second surface 200B, and/or the side surface 200C.

The electronic device 101 according to an embodiment may include a substantially transparent front plate 202. According to an embodiment, the front plate 202 may form at least a portion of the first surface 200A. According to an embodiment, the front plate 202 may include, for example, a glass plate including various coating layers or a polymer plate, but the disclosure is not limited thereto.

The electronic device 101 according to an embodiment may include a substantially opaque rear plate 211. According to an embodiment, the rear plate 211 may form at least a portion of the second surface 200B. According to an embodiment, the rear plate 211 may be formed of coated or colored glass, ceramic, polymer, metal (e.g., aluminum, stainless steel (STS), or magnesium), or a combination of at least two of the above materials.

The electronic device 101 according to an embodiment may include a side structure (or side member) 218. According to an embodiment, the side structure 218 may be coupled to the front plate 202 and/or the rear plate 211 to form at least a portion of the side surface 200C of the electronic device 101. For example, the side structure 218 may form all of the side surface 200C of the electronic device 101, and for another example, the side structure 218 may form the side surface 200C of the electronic device 101 together with the front plate 202 and/or the rear plate 211.

Unlike the illustrated embodiment, in the case that the side surface 200C of the electronic device 101 is partially formed by the front plate 202 and/or the rear plate 211, the front plate 202 and/or the rear plate 211 may include a region that is bent from its periphery toward the rear plate 211 and/or the front plate 202 and seamlessly extends. The extended region of the front plate 202 and/or the rear plate 211 may be positioned at both ends of, for example, a long edge of the electronic device 101, but the disclosure is not limited to the above-described examples.

According to an embodiment, the side structure 218 may include a metal and/or a polymer. According to an embodiment, the rear plate 211 and the side structure 218 may be integrally formed and may include the same material (e.g., a metal material such as aluminum), but the disclosure are not limited thereto. For example, the rear plate 211 and the side structure 218 may be formed in separate configurations and/or may include different materials.

According to an embodiment, the electronic device 101 may include at least one of a display 201, an audio module 203, 204 and 207, a sensor module (not shown), a camera module 205, 212, 213, a key input device 217, a light emitting device (not shown), and/or a connector hole 208. According to an embodiment, the electronic device 101 may omit at least one of the components (e.g., a key input device 217 or a light emitting device (not shown)), or may further include another component.

According to an embodiment, the display 201 may be visually exposed through a substantial portion of the front plate 202. For example, at least a portion of the display 201 may be visible through the front plate 202 forming the first surface 200A. According to an embodiment, the display 201 may be disposed on the second surface of the front plate 202.

According to an embodiment, the appearance of the display 201 may be formed substantially the same as the appearance of the front plate 202 adjacent to the display 201. According to an embodiment, in order to expand the area in which the display 201 is visually exposed, the distance between the outside of the display 201 and the outside of the front plate 202 may be formed to be generally the same.

According to an embodiment, the display 201 (or the first surface 200A of the electronic device 101) may include a screen display area 201A. According to an embodiment, the display 201 may provide visual information to a user through the screen display area 201A. In the illustrated embodiment, when the first surface 200A is viewed from the front, it is illustrated that the screen display area 201A is spaced apart from the outside of the first surface 200A and is positioned inside the first surface 200A, but the disclosure is not limited thereto. In an embodiment, when the first surface 200A is viewed from the front, at least a portion of the periphery of the screen display area 201A may substantially coincide with the periphery of the first surface 200A (or the front plate 202).

According to an embodiment, the screen display area 201A may include a sensing area 201B configured to obtain biometric information of a user. Here, the meaning of "the screen display area 201A including the sensing area 201B" may be understood to mean that at least a portion of the sensing area 201B may be overlapped on the screen display area 201A. For example, the sensing area 201B, like other areas of the screen display area 201A, may refer to an area in which visual information may be displayed by the display 201 and additionally biometric information (e.g., fingerprint) of a user may be obtained. In an embodiment, the sensing area 201B may be formed in the key input device 217.

According to an embodiment, the display 201 may include an area in which the first camera module 205 is positioned. According to an embodiment, an opening may be formed in the area of the display 201, and the first camera module 205 (e.g., a punch hole camera) may be at least partially disposed in the opening to face the first surface 200A. In such a case, the screen display area 201A may surround at least a portion of the periphery of the opening. According to an embodiment, the first camera module 205 (e.g., an under display camera (UDC)) may be disposed under the display 201 to overlap the area of the display 201. In this case, the display 201 may provide visual information to the user through the area, and additionally, the first camera module 205 may obtain an image corresponding to a direction facing the first surface 200A through the area of the display 201.

According to an embodiment, the display 201 may be coupled to or disposed adjacent to a touch sensing circuit, a pressure sensor capable of measuring the intensity (pressure) of the touch, and/or a digitizer that detects a magnetic field type stylus pen.

According to an embodiment, the audio modules 203, 204 and 207 may include microphone holes 203 and 204, and a speaker hole 207.

According to an embodiment, the microphone holes 203 and 204 may include a first microphone hole 203 formed in a partial area of the side surface 200C and a second microphone hole 204 formed in a partial area of the second surface 200B. A microphone (not shown) for obtaining an external sound may be disposed inside the microphone holes 203 and 204. The microphone may include a plurality of microphones to detect the direction of sound.

According to an embodiment, the second microphone hole 204 formed in a partial area of the second surface 200B may be disposed adjacent to the camera modules 205, 212 and 213. For example, the second microphone hole 204 may obtain sound according to operations of the camera modules 205, 212, and 213. However, the disclosure is not limited thereto.

According to an embodiment, the speaker hole 207 may include an external speaker hole 207 and a receiver hole (not illustrated) for a call. The external speaker hole 207 may be formed on a portion of the side surface 200C of the electronic device 101. According to an embodiment, the external speaker hole 207 may be implemented as a single hole together with the microphone hole 203. Although not illustrated, a receiver hole (not shown) for a call may be formed on another portion of the side surface 200C. For example, the receiver hole for a call may be formed on the opposite side of the external speaker hole 207 on the side surface 200C. For example, with respect to the illustration of FIG. 2, the external speaker hole 207 may be formed on the side surface 200C corresponding to the lower end of the electronic device 101, and the receiver hole for a call may be formed on the side surface 200C corresponding to the upper end of the electronic device 101. However, the disclosure is not limited thereto, and according to an embodiment, the receiver hole for a call may be formed at a position other than the side surface 200C. For example, the receiver hole for a call may be formed by a space spaced apart between the front plate 202 (or display 201) and the side bezel structure 218.

According to an embodiment, the electronic device 101 may include at least one speaker (not illustrated) configured to output sound to the outside of the housing 210 through an external speaker hole 207 and/or a receiver hole (not shown) for a call.

According to an embodiment, the sensor module (not shown) may generate an electrical signal or data value corresponding to an internal operating state or an external environmental state of the electronic device 101. For example, the sensor module may include at least one of a proximity sensor, an HRM sensor, a fingerprint sensor, a gesture sensor, a gyro sensor, a pressure sensor, a magnetic sensor, an acceleration sensor, a grip sensor, a color sensor, an infrared (IR) sensor, a biometric sensor, a temperature sensor, a humidity sensor, and an illumination sensor.

According to an embodiment, the camera modules 205, 212 and 213 may include a first camera module 205 disposed to face the first surface 200A of the electronic device 101, a second camera module 212 disposed to face the second surface 200B, and a flash 213.

According to an embodiment, the second camera module 212 may include a plurality of cameras (e.g., a dual camera, a triple camera, or a quad camera). However, the second camera module 212 is not necessarily limited to including a plurality of cameras, and may include one camera.

According to an embodiment, the first camera module 205 and the second camera module 212 may include one or a plurality of lenses, an image sensor, and/or an image signal processor.

According to an embodiment, the flash 213 may include, for example, a light emitting diode or a xenon lamp. According to an embodiment, two or more lenses (infrared camera, wide-angle and telephoto lens) and image sensors may be disposed on one side of the electronic device 101.

According to an embodiment, the key input device 217 (e.g., an input module 150 of FIG. 1) may be disposed on the side surface 200C of the electronic device 101. According to an embodiment, the electronic device 101 may not include some or all of the key input devices 217, and the key input device 217 not included therein may be implemented on the display 201 in another form such as a soft key.

According to an embodiment, the connector hole 208 may be formed on the side surface 200C of the electronic device 101 to accommodate the connector of the external device. A connection terminal electrically connected to the connector of the external device may be disposed in the connector hole 208. The electronic device 101 according to an embodiment may include an interface module for processing electrical signals transmitted and received through the connection terminal.

According to an embodiment, the electronic device 101 may include a light emitting device (not shown). For example, the light emitting device (not shown) may be disposed on the first surface 200A of the housing 210. The light emitting device (not shown) may provide state information of the electronic device 101 in a form of light. In an embodiment, the light emitting device (not shown) may provide a light source when the first camera module 205 is operated. For example, the light emitting device (not shown) may include an LED, an IR LED, and/or a xenon lamp.

Figure 3:
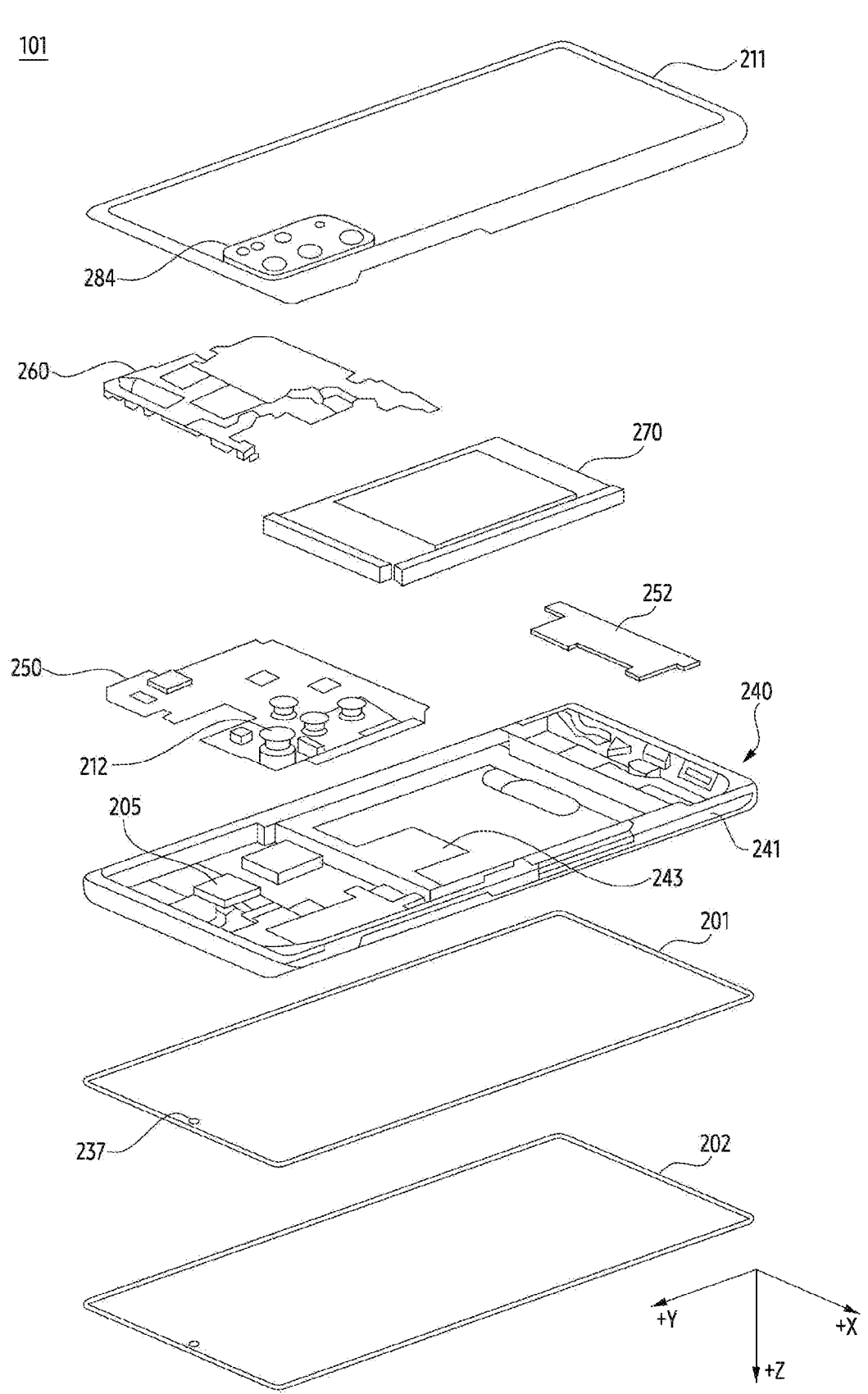
FIG. 3 is an exploded perspective view of an electronic device according to an embodiment.

FIG. 3 is an exploded perspective view of an electronic device according to an embodiment.

Hereinafter, overlapping descriptions of components having the same reference numerals as those of the above-described components will be omitted.

Referring to FIG. 3, the electronic device 101 according to an embodiment may include a frame structure 240, a first printed circuit board 250, a second printed circuit board 252, a cover plate 260, and a battery 270.

According to an embodiment, the frame structure 240 may include a sidewall 241 forming an exterior (e.g., the third surface 200C of FIG. 2) of the electronic device 101 and a support portion 243 extending inward from the sidewall 241. According to an embodiment, the frame structure 240 may be disposed between the display 201 and the rear plate 211. According to an embodiment, the sidewall 241 of the frame structure 240 may surround a space between the rear plate 211 and the front plate 202 (and/or the display 201), and the support portion 243 of the frame structure 240 may extend from the sidewall 241 within the space.

According to an embodiment, the frame structure 240 may support or accommodate other components included in the electronic device 101. For example, the display 201 may be disposed on one surface of the frame structure 240 facing one direction (e.g., the +z direction), and the display 201 may be supported by the support portion 243 of the frame structure 240. For another example, a first printed circuit board 250, a second printed circuit board 252, a battery 270, and a rear camera 212 may be disposed on the other surface facing a direction opposite to the one direction (e.g., the −z direction) of the frame structure 240. The first printed circuit board 250, the second printed circuit board 252, the battery 270, and the rear camera 212 may be mounted on a recess defined by the sidewall 241 and/or the support portion 243 of the frame structure 240.

According to an embodiment, the first printed circuit board 250, the second printed circuit board 252, and the battery 270 may be coupled to the frame structure 240, respectively. For example, the first printed circuit board 250 and the second printed circuit board 252 may be fixedly disposed in the frame structure 240 through a coupling member such as a screw. For example, the battery 270 may be fixedly disposed on the frame structure 240 through an adhesive member (e.g., a double-sided tape). However, it is not limited by the above-described example.

According to an embodiment, a cover plate 260 may be disposed between the first printed circuit board 250 and the rear plate 211. According to an embodiment, the cover plate 260 may be disposed on the first printed circuit board 250. For example, the cover plate 260 may be disposed on a surface facing the −z direction of the first printed circuit board 250.

According to an embodiment, the cover plate 260 may at least partially overlap the first printed circuit board 250 with respect to the z-axis. According to an embodiment, the cover plate 260 may cover at least a partial area of the first printed circuit board 250. Through this, the cover plate 260 may protect the first printed circuit board 250 from physical impact or prevent and/or reduce the connector coupled to the first printed circuit board 250 from being separated.

According to an embodiment, the cover plate 260 may be fixedly disposed on the first printed circuit board 250 through a coupling member (e.g., a screw), or may be coupled to the frame structure 240 together with the first printed circuit board 250 through the coupling member.

According to an embodiment, the display 201 may be disposed between the frame structure 240 and the front plate 202. For example, a front plate 202 may be disposed on one side (e.g., a +z direction) of the display 201 and a frame structure 240 may be disposed on the other side (e.g., a −z direction).

According to an embodiment, the front plate 202 may be coupled to the display 201. For example, the front plate 202 and the display 201 may adhere to each other through an optical adhesive member (e.g., optically clear adhesive (OCA) or optically clear resin (OCR)) interposed therebetween.

According to an embodiment, the front plate 202 may be coupled to the frame structure 240. For example, the front plate 202 may include an outside portion extending outside the display 201 when viewed in the z-axis direction, and may adhere to the frame structure 240 through an adhesive member (e.g., a double-sided tape) disposed between the outside portion of the front plate 202 and the frame structure 240 (e.g., the sidewall 241). However, it is not limited by the above-described example.

According to an embodiment, the first printed circuit board 250 and/or the second printed circuit board 252 may be equipped with a processor (e.g., a processor 120 of FIG. 1), a memory (e.g., a memory 130 of FIG. 1), and/or an interface (e.g., an interface 177 of FIG. 1). The processor may include, for example, one or more of a central processing unit, an application processor, a graphic processing unit, an image signal processor, a sensor hub processor, or a communication processor. The memory may include, for example, a volatile memory or a nonvolatile memory. The interface may include, for example, a high definition multimedia interface (HDMI), a universal serial bus (USB) interface, an SD card interface, and/or an audio interface. The interface may electrically or physically connect the electronic device 101 to an external electronic device, and may include a USB connector, an SD card/MMC connector, or an audio connector. According to an embodiment, the first printed circuit board 250 and the second printed circuit board 252 may be operatively or electrically connected to each other through a connection member (e.g., a flexible printed circuit board).

According to an embodiment, the battery 270 may supply power to at least one component of the electronic device 101. For example, the battery 270 may include a rechargeable secondary cell or a fuel cell. At least a portion of the battery 270 may be disposed on substantially the same plane as the first printed circuit board 250 and/or the second printed circuit board 252.

The electronic device 101 according to an embodiment may include an antenna module (not illustrated) (e.g., an antenna module 197 of FIG. 1). According to an embodiment, the antenna module may be disposed between the rear plate 211 and the battery 270. The antenna module may include, for example, a near field communication (NFC) antenna, a wireless charging antenna, and/or a magnetic secure transmission (MST) antenna. The antenna module, for example, may perform short-range communication with an external device, or wirelessly transmit and receive power to and from the external device.

According to an embodiment, the front camera 205 may be disposed in at least a portion (e.g., a support portion 243) of the frame structure 240 so that the lens may receive external light through a partial area (e.g., a camera area 237) of the front plate 202.

According to an embodiment, the rear camera 212 may be disposed between the frame structure 240 and the rear plate 211. According to an embodiment, the rear camera 212 may be electrically connected to the first printed circuit board 250 through a connection member (e.g., a connector). According to an embodiment, the rear camera 212 may be disposed such that the lens may receive external light through a camera area 284 of the rear plate 211 of the electronic device 101.

According to an embodiment, the camera area 284 may be formed on the surface (e.g., a second surface 200B of FIG. 2) of the rear plate 211. According to an embodiment, the camera area 284 may be formed to be at least partially transparent so that external light may be incident to the lens of the rear camera 212. According to an embodiment, at least a portion of the camera area 284 may protrude from the surface of the rear plate 211 to a predetermined height. However, it is not limited to thereto, and in an embodiment, the camera area 284 may form a plane substantially the same as the surface of the rear plate 211.

According to an embodiment, the housing (e.g., a housing 210 of FIG. 2) of the electronic device 101 may mean a configuration or structure forming at least a portion of the exterior of the electronic device 101. In this regard, at least a portion of the front plate 202, the frame structure 240, and/or the rear plate 211 forming the exterior of the electronic device 101 may be referred to as the housing of the electronic device 101.

Figure 4A:
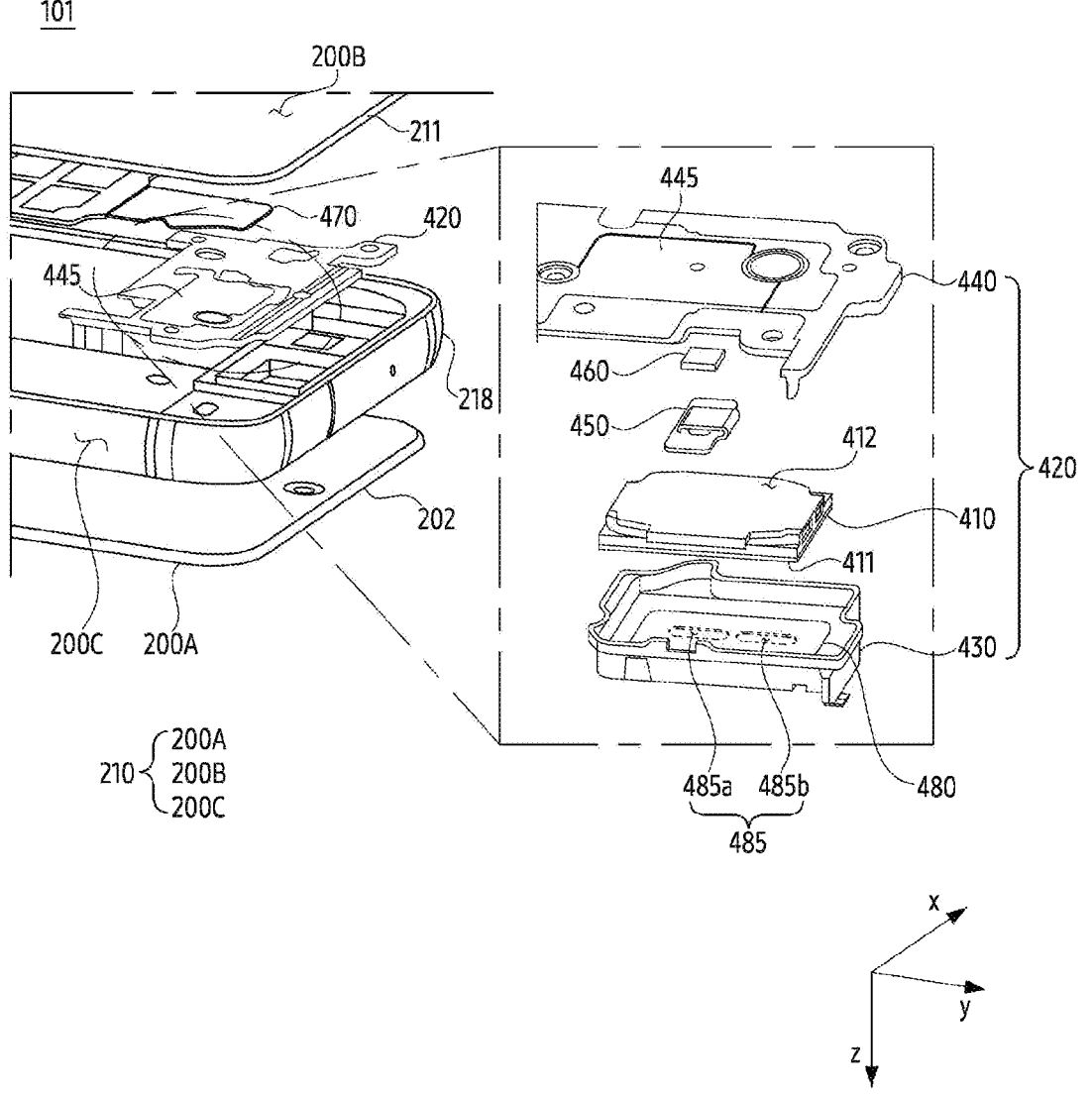
FIG. 4A is a partially exploded perspective view of an example electronic device.
Figure 4B:
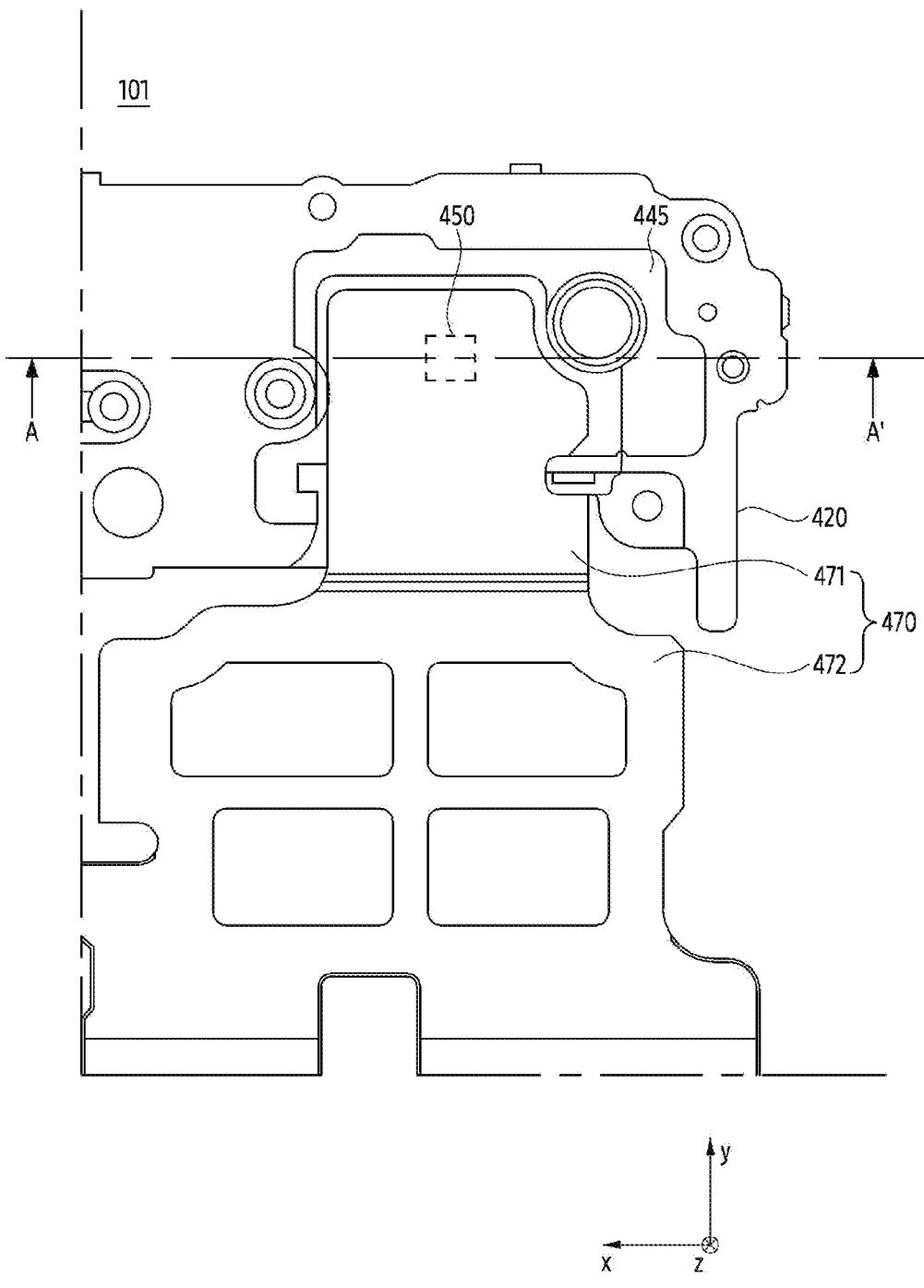
FIG. 4B illustrates an internal structure of an example electronic device.

FIG. 4A is a partially exploded perspective view of an example electronic device, and FIG. 4B illustrates an internal structure of an example electronic device.

Referring to FIGS. 4A and 4B, the electronic device 101 may include a housing 210, a speaker 410, an enclosure 420, and a supporting member 450.

According to an embodiment, the housing 210 may include a first surface 200A and a second surface 200B opposite to the first surface 200A. The housing 210 may provide an inner space for accommodating electronic components of the electronic device 101. For example, the housing 210 may further include a side surface 200C surrounding a space between the first surface 200A and the second surface 200B opposite to the first surface 200A. The housing 210 may provide an internal space surrounded by the first surface 200A, the second surface 200B, and the side surface 200C, for accommodating various electronic components (e.g., the speaker 410) of the electronic device 101. According to an embodiment, the housing 210 may refer to a structure that forms at least a portion of the first surface 200A, the second surface 200B, and/or the side surface 200C.

For example, the front plate 202 and/or the display (e.g., the display 201 of FIG. 2) may form the first surface 200A of the housing 210. The display 201 may be disposed on the first surface 200A. For example, the rear plate 211 may form the second surface 200B of the housing 210. For example, the side structure 218 may form the side surface 200C of the housing 210. For example, the speaker 410 may be disposed in the inner space of the electronic device 101 surrounded by the front plate 202, the rear plate 211, and the side structure 218. For example, the side surface 200C of the housing 210 and/or the side structure 218 forming the side surface 200C may include a speaker hole 207 for audio output from the speaker 410. The speaker 410 may be disposed adjacent to a portion of the side surface 200C including the speaker hole 207 in the internal space of the electronic device 101 in order to transfer the audio output from the speaker to the outside of the electronic device 101.

According to an embodiment, the speaker 410 may output audio. The speaker 410 may include a third surface 411 facing the first surface 200A of the housing 210 and used to output the audio, and a fourth surface 412 facing the second surface 200B of the housing 210. The fourth surface 412 may include a yoke.

For example, the third surface 411 of the speaker 410 may be configured to face the front plate 202 forming the first surface 200A of the housing 210. For example, the third surface 411 of the speaker 410 may be a surface facing the display 201 of the electronic device 101. For example, the third surface 411 may include a diaphragm for outputting the audio from the speaker 410.

For example, although not illustrated herein, the speaker 410 may include at least one voice coil for providing vibration to a diaphragm in the speaker 410, and at least one a magnet capable of forming a magnetic field. When a current flows through the at least one voice coil, a magnetic field formed around the at least one voice coil may interact with the magnetic field formed by the magnet to vibrate the voice coil. The diaphragm connected to the at least one voice coil may be configured to vibrate according to the vibration generated by the at least one voice coil. The speaker 410 may be configured to output the audio through the third surface 411 based on the vibration of the diaphragm.

For example, the fourth surface 412 of the speaker 410 may face the rear plate 211 forming the second surface 200B of the housing 210. For example, the fourth surface 412 may include a yoke configured to amplify a magnetic field formed to output an audio sound in the speaker 410. The yoke may include a magnetic circuit for amplifying the magnetic field formed in the speaker 410. The yoke may be a metal plate forming the fourth surface 412.

For example, when operated to output audio, the speaker 410 may radiate heat to the surroundings of the speaker 410. For example, when outputting the audio, the speaker 410 may be configured to radiate heat toward the first surface 200A of the housing 210 through the third surface 411 of the speaker 410. For example, the speaker 410 may be configured to radiate heat toward the second surface 200B of the housing 210 through the fourth surface 412 of the speaker 410, when outputting the audio.

According to an embodiment, the enclosure 420 may surround at least part of the speaker 410. The enclosure 420 may include a heat dissipation portion 445 facing the fourth surface 412 of the speaker 410 and spaced apart from the fourth surface 412.

For example, the enclosure 420 may cover the fourth surface 412 of the speaker 410. For example, the enclosure 420 may expose at least a portion of the third surface 411 of the speaker 410 to the outside of the enclosure 420 in order to provide a path for audio output from the speaker 410.

For example, the heat dissipation portion 445 may be arranged to face the fourth surface 412 of the speaker 410. For example, the heat dissipation portion 445 may be a portion to which heat emitted through the fourth surface 412 of the speaker 410 is transferred, when the speaker 410 outputs the audio. For example, the heat dissipation portion 445 may be arranged in between the fourth surface 412 of the speaker 410 and the second surface 200B of the housing 210.

According to an embodiment, the enclosure 420 may include a first enclosure 430 and a second enclosure 440.

For example, the first enclosure 430 may be in contact with the third surface 411 of the speaker 410. The first enclosure 430 may expose at least a portion of the third surface 411 to the outside of the enclosure 420, in order to provide a path for audio emitted from the third surface 411. The first enclosure 430 may include a groove for accommodating the speaker 410.

For example, the second enclosure 440 may be coupled to the first enclosure 430. For example, the second enclosure 440 may extend from the first enclosure 430. For example, the second enclosure 440 may be coupled to the first enclosure 430 to surround at least a portion of the speaker 410 together with the first enclosure 430. For example, the second enclosure 440 may be a portion including the heat dissipation portion 445 of the enclosure 420. The enclosure 420 may include the first enclosure 430 and the second enclosure 440 so as to protect the speaker 410 from an external impact and provide the speaker 410 with a space for resonance of the audio output from the speaker 410.

Heretofore, the enclosure 420 has been described as being distinct from the housing 210, but the disclosure is not limited thereto and the enclosure 420 may be a part of the housing 210.

For example, although not illustrated herein, the first enclosure 430 may be a part of the front plate 202 forming the first surface 200A of the housing 210. The second enclosure 440 may be a part of the rear plate 211 forming the second surface 200B opposite to the first surface 200A of the housing 210.

For example, although not illustrated herein, the enclosure 420 may be a part (e.g., a side wall 241 and/or a supporting portion 243 of FIG. 3) of the side structure 218 forming the side surface 200C of the housing 210 or the frame structure (e.g., the frame structure 240 of FIG. 3). The enclosure 420 may be configured as a part of the housing 210 to provide an additional space for accommodating electronic components (e.g., the speaker 410) in the housing 210.

According to an embodiment, the heat dissipation portion 445 may include metal. For example, the heat dissipation portion 445 may be made of a material different from the remaining portion of the enclosure 420 except for the heat dissipation portion 445. For example, the heat dissipation portion 445 may be manufactured of a material having relatively higher thermal conductivity. For example, the heat dissipation portion 445 may include, but is not limited to, stainless used steel (SUS) and/or clad metal. The clad metal may refer to a laminated plate in which on one surface or both surfaces of a layer made of a metal or non-metal material is stacked a metal different from the material of the layer. For example, the clad metal may be manufactured of a laminated plate in which on one surface or both surfaces of a layer made of a base material of the enclosure 420 is stacked a metal different from the material of the layer.

According to an embodiment, the supporting member 450 may be disposed in between the fourth surface 412 of the speaker 410 and the enclosure 420.

For example, the supporting member 450 may be disposed in a space between the fourth surface 412 of the speaker 410 and the heat dissipation portion 445 facing the fourth surface 412. For example, the supporting member 450 may be disposed on the fourth surface 412 of the speaker 410 in the enclosure 420.

Throughout the disclosure, it is to be appreciated that when an element is referred to as being "on" another element, it may be directly on the other element or there may be intervening elements therebetween. For example, throughout the disclosure, an expression "B disposed on A" may refer to "B in contact with A". For example, throughout the disclosure, an expression "B disposed on A" may refer to "B facing away from A". For example, an expression "a supporting member disposed on a fourth surface" may refer to "a supporting member in contact with a fourth surface". For example, an expression "a supporting member disposed on a fourth surface" may refer to "a supporting member facing away a fourth surface". The heat dissipation portion 445 may be disposed on the supporting member 450. The supporting member 450 may be disposed underneath the heat dissipation portion 445 (e.g., in −Z-axis).

For example, the supporting member 450 may be coupled to the fourth surface 412. For example, the supporting member 450 may be attached to the fourth surface 412. For example, the supporting member 450 may be fastened to the fourth surface 412 through at least one component (e.g., an adhesive material) between the fourth surface 412 and the supporting member 450.

For example, the heat dissipation portion 445 may face at least a portion (e.g., a second portion 452 of FIG. 5) of the supporting member 450 disposed on the fourth surface 412. The supporting member 450 may be configured to support the heat dissipation portion 445 with at least a portion of the supporting member 450 facing the heat dissipation portion 445. Throughout the disclosure, it is to be noted that when it is referred to as "an element supports another element", it may mean that, for example, the two elements directly supporting each other in contact with each other or that a certain separate element may exist between the two elements to indirectly support each other, and thus, the arrangement between the two elements is not limited thereto. The supporting member 450 may be disposed between the heat dissipation portion 445 and the fourth surface 412 of the speaker 410, thereby reducing vibration of the speaker 410 in the enclosure 420 as the speaker 410 operates.

For example, the supporting member 450 may be configured to transfer at least part of the heat emitted from the fourth surface 412 of the speaker 410 to the heat dissipation portion 445 of the enclosure 420, when the speaker 410 outputs audio. The supporting member 450 may be disposed between the fourth surface 412 and the heat dissipation portion 445, thereby increasing a distance between the fourth surface 412 and the heat dissipation portion 445. The supporting member 450 may further provide a heat transfer path between the fourth surface 412 and the heat dissipation portion 445, thereby reducing the heat transferred from the speaker 410 to the heat dissipation portion 445.

According to an embodiment, the electronic device 101 may further include a heat insulating member 460. The heat insulating member 460 may be disposed between the supporting member 450 and the heat dissipation portion 445 so as to reduce the heat transferred from the speaker 410 to the heat dissipation portion 445 of the enclosure 420, when the audio is output from the speaker 410. The heat insulating member 460 may be in contact with the supporting member 450 and the heat dissipation portion 445. For example, one surface of the heat insulating member 460 may be in contact with the supporting member 450. The other surface of the heat insulating member 460 opposite to the one surface may be in contact with the heat dissipation portion 445 of the enclosure 420. For example, the heat insulating member 460 may overlap the supporting member 450 and the heat dissipation portion 445, when viewed from above. For example, the heat insulating member 460 may be attached on a portion (e.g., the second portion 452 of FIG. 5) facing the heat dissipation portion 445 of the supporting member 450. Owing to inclusion of the heat insulating member 460, the electronic device 101 may reduce the heat transferred from the supporting member 450 to the heat dissipation portion 445.

According to an embodiment, the rigidity of the supporting member 450 may be greater than that of the heat insulating member 460. The heat insulating member 460 may be deformable by vibration generated from the speaker 410, when the audio is output from the speaker 410. For example, the heat insulating member 460 may be compressed or stretched by vibrations generated by the speaker 410 due to the operation of the speaker 410. For example, the heat insulating member 460 may have a sponge shape including a material having relatively low thermal conductivity, but the disclosure is not limited thereto. Owing to inclusion of the heat insulating member 460 deformable by vibration of the speaker 410, the electronic device 101 may reduce damage to the supporting member 450 and/or the enclosure 420 that may be caused by the vibration generated by the speaker 410.

According to an embodiment, the electronic device 101 may further include a heat dissipation member 470. The heat dissipation member 470 may include a first region 471 disposed between the heat dissipation portion 445 and the second surface 200B, and a second region 472 extending from the first region 471, so as to reduce the heat transferred from the heat dissipation portion 445 of the enclosure 420 to the second surface 200B of the housing 210, when the audio is output from the speaker 410.

For example, the first region 471 of the heat dissipation member 470 may be disposed on the heat dissipation portion 445 of the enclosure 420. The second surface 200B of the housing 210 may be disposed on the heat dissipation member 470. For example, the first region 471 of the heat dissipation member 470 may be in contact with an outer surface of the heat dissipation portion 445. An inner surface of the heat dissipation portion 445 opposite to the outer surface of the heat dissipation portion 445 may be disposed to face the supporting member 450. At least part of the heat emitted from the fourth surface 412 of the speaker 410 may be transferred to the first region 471 through the supporting member 450 and the heat dissipation portion 445.

For example, the second region 472 of the heat dissipation member 470 may be spaced apart from the enclosure 420. For example, the second region 472 of the heat dissipation member 470 may extend from the first region 471 to dissipate at least part of the heat transferred from the heat dissipation portion 445 of the enclosure 420 to the first region 471, around the enclosure 420. Owing to the heat dissipation member 470 including the first region 471 between the heat dissipation portion 445 and the housing 200B and the second region 472 extending from the first region 471, the heat dissipation member may reduce the heat transferred from the heat dissipation portion 445 to the second surface 200B. According to an embodiment, the heat dissipation member 470 may include a material having relatively high thermal conductivity. For example, the heat dissipation member 470 may include copper and/or silicon, but the disclosure is not limited thereto.

According to an embodiment, the first region 471 of the heat dissipation member 470 may overlap a portion (e.g., the second portion 452 of FIG. 5) adjacent to the enclosure 420 of the supporting member 450, when the second surface 200B of the housing 210 is viewed from above.

Figure 5:
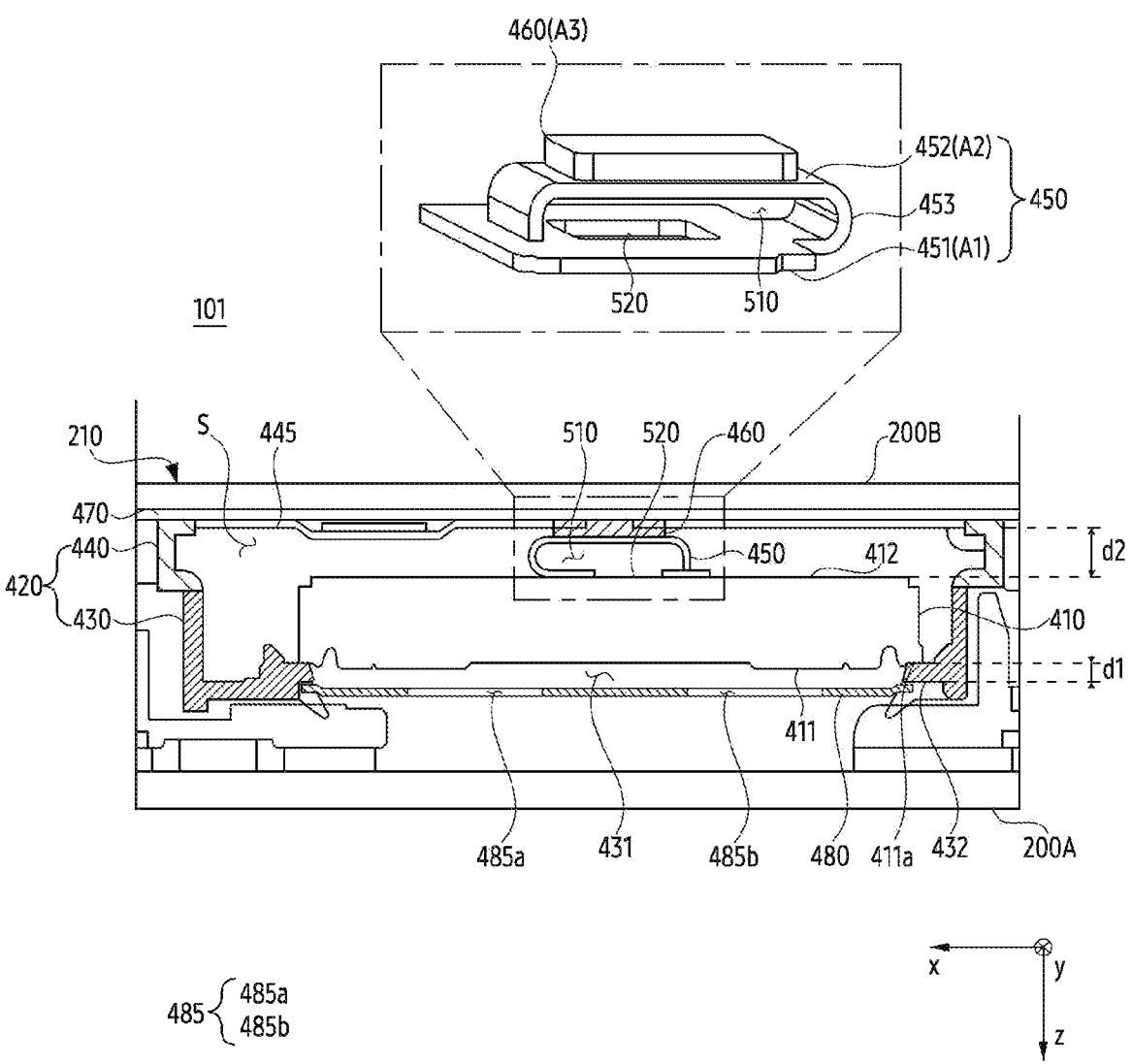
FIG. 5 is a cross-sectional view of an example electronic device for line A-A' of FIG. 4B.

For example, referring to FIG. 5 together, the second portion 452 of the supporting member 450 may be a portion of the supporting member 450, adjacent to the enclosure 420 amongst the speaker 410 and the enclosure 420. The second portion 452 may be arranged to face an inner surface of the heat dissipation portion 445. At least part of the heat emitted from the fourth surface 412 of the speaker 410 may be transferred to the heat dissipation portion 445 through the second portion 452 of the supporting member 450. The first region 471 of the heat dissipation member 470 may be in contact with an outer surface of the heat dissipation portion 445 opposite to the inner surface of the heat dissipation portion 445 facing the second portion 452. Since the first region 471 is disposed between the heat dissipation portion 445 and the second surface 200B of the housing 210, the first region 471 may overlap the second portion 452 when the second surface 200B is viewed from above. The first region 471 of the heat dissipation member 470 may overlap the second portion 452 of the supporting member 450 when the second surface 200B is viewed from above, thereby causing the heat transferred from the fourth surface 412 of the speaker 410 through the supporting member 450 and the heat dissipation portion 445 to heat dissipation member 470 to be diffused to the second region 472 extending from the first region 471. The heat dissipation member 470 may diffuse the heat transferred to the heat dissipation member 470, thereby reducing the heat transferred to the second surface 200B from the heat dissipation portion 445.

According to the above-described embodiment, the electronic device 101 includes the enclosure 420 including the heat dissipation portion 445 facing the fourth surface 412 of the speaker 410, so as to reduce the heat transferred from the speaker 410 to the second surface 200B of the housing 210. The electronic device 101 may include the supporting member 450 disposed between the heat dissipation portion 445 and the fourth surface 412, thereby reducing vibrations of the speaker 410 when the speaker 410 outputs audio and reducing the heat transferred from the speaker 410 to the heat dissipation portion 445. According to an embodiment, the electronic device 101 may further include the heat insulating member 460 disposed between the supporting member 450 and the heat dissipation portion 445, thereby reducing the heat transferred from the speaker 410 through the supporting member 450 to the heat dissipation portion 445. According to an embodiment, the electronic device 101 may further include the heat dissipation member 470 between the heat dissipation portion 445 and the second surface 200B, thereby reducing the heat transferred from the heat dissipation portion 445 to the second surface 200B.

FIG. 5 is a cross-sectional view of an example electronic device taken along line A-A' of FIG. 4B.

Referring to FIG. 5, the electronic device 101 may include a housing 210, a speaker 410, an enclosure 420, and a supporting member 450. The housing 210 may include a first surface 200A and a second surface 200B opposite to the first surface 200A. The speaker 410 may include a third surface 411 facing the first surface 200A and a fourth surface 412 facing the second surface 200B. The enclosure 420 may include a heat dissipation portion 445 facing the fourth surface 412.

According to an embodiment, the third surface 411 of the speaker 410 may be a surface facing the first surface 200A of the housing 210 and/or a structure (e.g., the display 201 and/or the front plate 202 of FIG. 2) forming the first surface 200A. The fourth surface 412 opposite to the third surface 411 of the speaker 410 may be a surface facing the second surface 200B opposite to the first surface 200A of the housing 210 and/or a structure (e.g., the rear plate 211 of FIG. 2) forming the second surface 200B.

According to an embodiment, although not illustrated herein, the third surface 411 may include a diaphragm. The diaphragm may vibrate in a direction (e.g., +z direction) toward the first surface 200A of the housing 210 or a direction (e.g., −z direction) toward the second surface 200B opposite to the first surface 200A, with respect to the third surface 411. The speaker 410 may be configured to output a sound signal to the outside of the electronic device 101, based on the vibration of the diaphragm disposed on the third surface 411. According to an embodiment, although not illustrated herein, the third surface 411 may include a waterproof structure for blocking foreign substances flowing into an inner space of the enclosure 420.

According to an embodiment, the third surface 411 may include a waterproof part 411a. For example, the waterproof portion 411a may be disposed along a periphery of the third surface 411. For example, the waterproof portion 411a may be a portion of the third surface 411 that is in contact with the enclosure 420. For example, the waterproof portion 411a may be a portion in contact with the supporting portion 432 supporting the speaker 410 of the enclosure 420. For example, the waterproof portion 411a may be a portion in contact with the first enclosure 430 including an audio hole 431 facing the third surface 411. The third surface 411 may include the waterproof portion 411a to prevent and/or reduce foreign substances from flowing into the inner space of the enclosure 420 from the outside.

According to an embodiment, although not illustrated herein, the fourth surface 412 may include a yoke. The yoke may form at least part of the external appearance of the speaker 410 forming the fourth surface 412. The yoke may include a magnetic circuit to amplify a magnetic field formed in the speaker 410. According to an embodiment, the fourth surface 412 may include a structure (e.g., the supporting member 450) for supporting the fourth surface 412 in order to reduce movement of the speaker 410 by vibrations output from the speaker 410.

According to an embodiment, the supporting member 450 may include a first portion 451, a second portion 452, and a third portion 453 connecting the first portion 451 and the second portion 452. The first portion 451 may be disposed on the fourth surface 412 of the speaker 410. The second portion 452 may be formed to face the heat dissipation portion 445 of the enclosure 420.

For example, the first portion 451 may be a portion of the supporting member 450, adjacent to the fourth surface 412 amongst the fourth surface 412 and the heat dissipation portion 445. For example, the first portion 451 may be in contact with the fourth surface 412. For example, the first portion 451 may support the fourth surface 412. For example, the first portion 451 may be fixed onto the fourth surface 412 through a component (e.g., an adhesive member) interposed between the first portion 451 and the fourth surface 412.

For example, the second portion 452 may be a portion of the supporting member 450, adjacent to the heat dissipation portion 445 among the fourth surface 412 and the heat dissipation portion 445. For example, the heat dissipation portion 445 may be spaced apart from the second portion 452, facing the same. For example, when the speaker 410 outputs audio, the second portion 452 may release at least part of the heat transferred from the speaker 410 to the supporting member 450, to the heat dissipation portion 445. For example, the second portion 452 may transfer at least part of the heat transferred from the speaker 410 to the supporting member 450, through one component (e.g., the heat insulating member 460) between the second portion 452 and the heat dissipation portion 445, to the heat dissipation portion 445.

For example, the third portion 453 may extend from the first portion 451 to the second portion 452. For example, the third portion 453 may support the first portion 451 and the second portion 452 such that a distance d2 between the fourth surface 412 of the speaker 410 and the heat dissipation portion 445 is maintained, when the speaker 410 outputs audio. The third portion 453 may support the first portion 451 and the second portion 452 when the speaker 410 outputs audio, thereby reducing damage to the supporting member 450 caused by the vibrations of the speaker 410.

According to an embodiment, the thickness of the third portion 453 may be less than the thickness of the first portion 451 and/or the thickness of the second portion 452. Since the thickness of the third portion 453 is less than the thickness of the first portion 451 and/or the thickness of the second portion 452, the third portion 453 may reduce the heat transferred from the first portion 451 to the second portion 452.

According to an embodiment, the area A1 of the first portion 451 of the supporting member 450 disposed on the fourth surface 412 of the speaker 410 may be larger than the area A2 of the second portion 452 of the supporting member 450 facing the heat dissipation portion 445 of the enclosure 420.

For example, when the supporting member 450 is viewed from above, the second portion 452 may overlap part of the first portion 451. For example, the area A1 of the first portion 451 disposed on the fourth surface 412 may correspond to an area of one surface of the first portion 451 facing the fourth surface 412. The area A2 of the second portion 452 facing the heat dissipation portion 445 may be an area of one surface of the second portion 452 facing the heat dissipation portion 445. The area of the one surface of the first portion 451 facing the fourth surface 412 may be greater than the area of the one surface of the second portion 452 facing the heat dissipation portion 445. Since the area A1 of the first portion 451 disposed on the fourth surface 412 is greater than the area A2 of the second portion 452 facing the heat dissipation portion 445, the first portion 451 may reduce the vibrations of the speaker 410 while the speaker 410 outputs audio. Since the area A2 of the second portion 452 facing the heat dissipation portion 451 is less than the area A1 of the first portion 451 disposed on the fourth surface 412, the second portion 452 may reduce the heat transferred from the fourth surface 412 through the supporting member 450 to the heat dissipation portion 445, when the speaker 410 outputs audio.

According to an embodiment, the electronic device 101 may further include the heat insulating member 460 disposed between the supporting member 450 and the heat dissipation portion 445 and contacting the second portion 452 of the supporting member 450 and the heat dissipation portion 445, so as to reduce the heat transferred from the speaker 410 to the heat dissipation portion 445, when the audio is output from the speaker 410. According to an embodiment, the area A2 of the second portion 452 of the supporting member 450, which is in contact with the heat insulating member 460 and faces the heat dissipation portion 445, may be greater than the area A3 of the heat insulating member 460, which is in contact with the heat dissipation portion 445.

For example, the second portion 452 may be spaced apart from the heat dissipation portion 445, facing the same. One surface of the second portion 452 facing the heat dissipation portion 445 may be in contact with the heat insulating member 460. The area A3 of one surface of the heat insulating member 460 in contact with the heat dissipation portion 445 may be smaller than the area A2 of the one surface of the second portion 452 in contact with the heat insulating member 460. For example, the area A2 of one surface of the second portion 452 contacting the heat insulating member 460 and facing the heat dissipation portion 445 may be greater than the area A3 of the heat dissipation portion 445 contacting the heat insulating member 460. For example, when the heat dissipation portion 445 is viewed from above, the size of the heat insulating member 460 may be less than that of the second portion 452. For example, when the heat dissipation portion 445 is viewed from above, the heat insulating member 460 may overlap part of the second portion 452. Since the area A3 of the heat insulating member 460 in contact with the heat dissipation portion 445 is less than the area A2 of the second portion 452 facing the heat dissipation portion 445, the heat insulating member 460 may reduce the heat transferred from the fourth surface 412 of the speaker 410 through the second portion 452 of the supporting member 450 to the heat dissipation portion 445.

According to an embodiment, the third portion 453 of the supporting member 450 may include at least one air gap 510 configured to pass air in the enclosure 420 in order to reduce the heat transferred from the first portion 451 of the supporting member 450 to the second portion 452 of the supporting member 450, when the audio is output from the speaker 410.

For example, the at least one air gap 510 may be surrounded by a first portion 451, a second portion 452, and a third portion 453 connecting the first portion 451 and the second portion 452. For example, the at least one air gap 510 may be connected to an inner space (e.g., the resonance space S) of the enclosure 420. For example, the at least one air gap 510 may include at least part of the air in the enclosure 420. The third portion 453 of the supporting member 450 may include the at least one air gap 510, thereby reducing the thickness of the third portion 453. Owing to reduction of the thickness of the third portion 453, the third portion 453 may reduce the heat transferred from the first portion 451 to the second portion 452. Owing to including the at least one air gap 510 configured to pass air in the enclosure 420, the third portion 453 may be configured to transfer at least part of the heat transferred from the first portion 451 to the second portion 452, to the air passing through the at least one air gap 510. Since the at least one air gap 510 is configured to transfer at least part of the heat transferred from the first portion 451 to the second portion 452, to the air passing through the at least one air gap 510, it makes it possible to reduce the heat transferred from the speaker 410 through the supporting member 450 to the heat dissipation portion 445.

According to an embodiment, the first portion 451 of the supporting member 450 may include an opening 520. The opening 520 may be in contact with the fourth surface 412 of the speaker 410 and may be connected to at least one air gap 510.

For example, the opening 520 may penetrate the first portion 451. For example, the opening 520 may be in contact with an inner surface of at least one air gap 510. For example, the opening 520 may be connected to the inner space of the enclosure 420 through at least one air gap 510. The first portion 451 may include the opening 520 connected to the at least one air gap 510, thereby further including air passing through the at least one air gap 510. Owing to inclusion of the air, the opening 520 may be configured to transfer at least part of the heat transferred from the fourth surface 412 of the speaker 410 to the supporting member 450, to the air included in the opening 520. Since the air included in the opening 520 includes at least part of the heat transferred from the fourth surface 412 to the supporting member 450, the opening 520 may reduce the heat transferred from the fourth surface 412 through the supporting member 450 to the heat dissipation portion 445.

According to an embodiment, the third portion 453 of the supporting member 450 may be at least partially bent to extend from the first portion 451 to the second portion 452. For example, the third portion 453 may have a curvature. For example, the first portion 451 may have a planar shape facing the fourth surface 412 to support the fourth surface 412 of the speaker 410. The second portion 452 may have a planar shape to support the heat dissipation portion 445 of the enclosure 420. The third portion 453 may be a portion that extends from the first portion 451 to the second portion 452 and has a curved shape. As the third portion 453 is at least partially bent, the path of the heat transferred from the first portion 451 to the second portion 452 may be lengthened. As the path of the heat transferred from the first portion 451 to the second portion 452 becomes longer, the heat transferred from the fourth surface 412 through the supporting member 450 to the heat dissipation portion 445 may be reduced.

According to an embodiment, in order to provide a path through which the audio of the speaker 410 is output, the enclosure 420 may further include an audio hole 431 facing the third surface 411 of the speaker 410 and a supporting portion 432 disposed along a periphery of the audio hole 431 and supporting the third surface 411. The thickness d1 of the supporting portion 432 may be less than the distance d2 between the fourth surface 412 of the speaker 410 and the heat dissipation portion 445.

For example, the audio hole 431 may expose at least a portion of the third surface 411 to the outside of the enclosure 420. For example, the audio hole 431 may be connected to a speaker hole (e.g., the speaker hole 207 of FIG. 2) of the housing 210 to provide a path for audio output from the third surface 411 of the speaker 410.

For example, the supporting portion 432 may support the periphery of the third surface 411. For example, the supporting portion 432 may extend from the inner surface of the audio hole 431. For example, the supporting portion 432 may be a portion in contact with the speaker 410 of the enclosure 420.

For example, the enclosure 420 may further include a first enclosure 430 in contact with at least a portion of the third surface 411 of the speaker 410, and a second enclosure 440 coupled to the first enclosure 430 and covering the fourth surface 412 of the speaker 410 opposite to the third surface 411. The first enclosure 430 may be a portion including the audio hole 431 of the enclosure 420 and the supporting portion 432 disposed along the periphery of the audio hole 431. The enclosure 420 may include the audio hole 431 to provide a path through which the audio output from the third surface 411 is transmitted to the outside of the electronic device 101. The enclosure 420 may include the supporting portion 432 for supporting the third surface 411, thereby reducing vibrations of the speaker 410 when the speaker 410 outputs the audio.

For example, the supporting portion 432 may form a periphery of the audio hole 431. The third surface 411 of the speaker 410 may face the audio hole 431, and the fourth surface 412 of the speaker 410 opposite to the third surface 411 may face the heat dissipation portion 445. As the thickness d1 of the supporting portion 432 forming the periphery of the audio hole 431 and supporting the third surface 411 becomes smaller, the distance d2 between the fourth surface 412 opposite to the third surface 411 and the heat dissipation portion 445 may become larger. Since the thickness d1 of the supporting portion 432 is less than the distance d2 between the fourth surface 412 and the heat dissipation portion 445, the supporting portion 432 may provide a space for the supporting member 450 in the enclosure 420 and reduce the heat transferred from the fourth surface 412 to the heat dissipation portion 445.

According to an embodiment, the enclosure 420 may further include a resonance space S configured to surround at least a portion of the speaker 410 and resonate the audio output from the speaker 410. The supporting portion 432 of the enclosure 420 may seal the resonance space S.

For example, the resonance space S may be in contact with the fourth surface 412 opposite to the third surface 411 from which the audio of the speaker 410 is output. For example, the resonance space S may be an inner space of the enclosure 420. For example, the resonance space S may be configured to be separated from the outside of the enclosure 420 by the speaker 410 and the enclosure 420. For example, the resonance space S may be defined as a space surrounded by the enclosure 420 and the speaker 410.

For example, a vibration range of the diaphragm in the speaker 410 may be limited as the frequency of the audio output from the third surface 411 by the diaphragm gets lower. The resonance space S may provide an extra space for resonance of the audio, thereby reducing the limitation of the vibration range of the diaphragm.

For example, the supporting portion 432 may be in contact with the third surface 411 of the speaker 410, thereby sealing the resonance space S in contact with the fourth surface 412 of the speaker 410 opposite to the third surface 411. The supporting portion 452 may seal the resonance space S to prevent and/or reduce foreign substances from flowing into the resonance space S from the outside of the enclosure 420.

For example, since the thickness d1 of the supporting portion 432 is less than the distance d2 between the fourth surface 412 and the heat dissipation portion 445, the resonance space S may have an extra space between the fourth surface 412 and the heat dissipation portion 445. Owing to including the additional space, the resonance space S may reduce the heat transferred from the fourth surface 412 to the heat dissipation portion 445, when the speaker 410 outputs the audio.

According to an embodiment, the enclosure 420 may further include a shielding structure 480 for shielding at least a portion of the third surface 411 of the speaker 410. The shielding structure 480 may be in contact with the periphery of the audio hole 431 of the enclosure 420. The shielding structure 480 may include at least one through hole 485 overlapping the third surface 411 of the speaker 410, when viewed from above.

For example, the shielding structure 480 may protrude from the supporting portion 432 of the first enclosure 430 toward the outside of the first enclosure 430. For example, the shielding structure 480 may cover at least part of the audio hole 431. For example, the shielding structure 480 may overlap the third surface 411 of the speaker 410, when viewed from above. Owing to including the shielding structure 480, the enclosure 420 may reduce damage to the third surface 411 of the speaker 410 and/or the diaphragm disposed on the third surface 411 due to an external impact, and may reduce inflow of foreign substances from the outside of the enclosure 420 through the audio hole 431.

For example, the at least one through hole 485 of the shielding structure 480 may include a first through hole 485a and a second through hole 485b. The first through hole 485a and the second through hole 485b may be spaced apart from each other. Each of the through holes 485a and 485b may overlap the third surface 411 of the speaker 410, when viewed from above. Each of the through holes 485a and 485b may be connected to the audio hole 431. The shielding structure 480 may include the through-holes 485a and 485b connected to the audio hole 431 to provide a path for the audio output from the third surface 411 of the speaker 410 to the outside of the electronic device 101.

According to the above-described embodiment, the electronic device 101 may include a supporting member 450 disposed between the fourth surface 412 of the speaker 410 and the heat dissipation portion 445, thereby reducing the heat transferred from the fourth surface 412 to the heat dissipation portion 445 of the enclosure 420, when the speaker 410 outputs the audio. Since the area A1 of the first portion 451 is greater than the area A2 of the second portion 452, the supporting member 450 may reduce vibrations of the speaker 410 when the speaker 410 outputs the audio. Since the area A2 of the second portion 452 is less than the area A1 of the first portion, the supporting member 450 may reduce the heat transferred from the fourth surface 412 through the supporting member 450 to the heat dissipation portion 445. According to an embodiment, the electronic device 101 may further include the second portion 452 and the heat insulating member 460 in contact with the heat dissipation portion 445, thereby reducing the heat transferred from the second portion 452 to the heat dissipation portion 445. According to an embodiment, the third portion 453 of the supporting member 450 may include at least one air gap 510 configured to pass air in the enclosure 420, thereby reducing the heat transferred from the first portion 451 to the second portion 452.

Figure 6A:
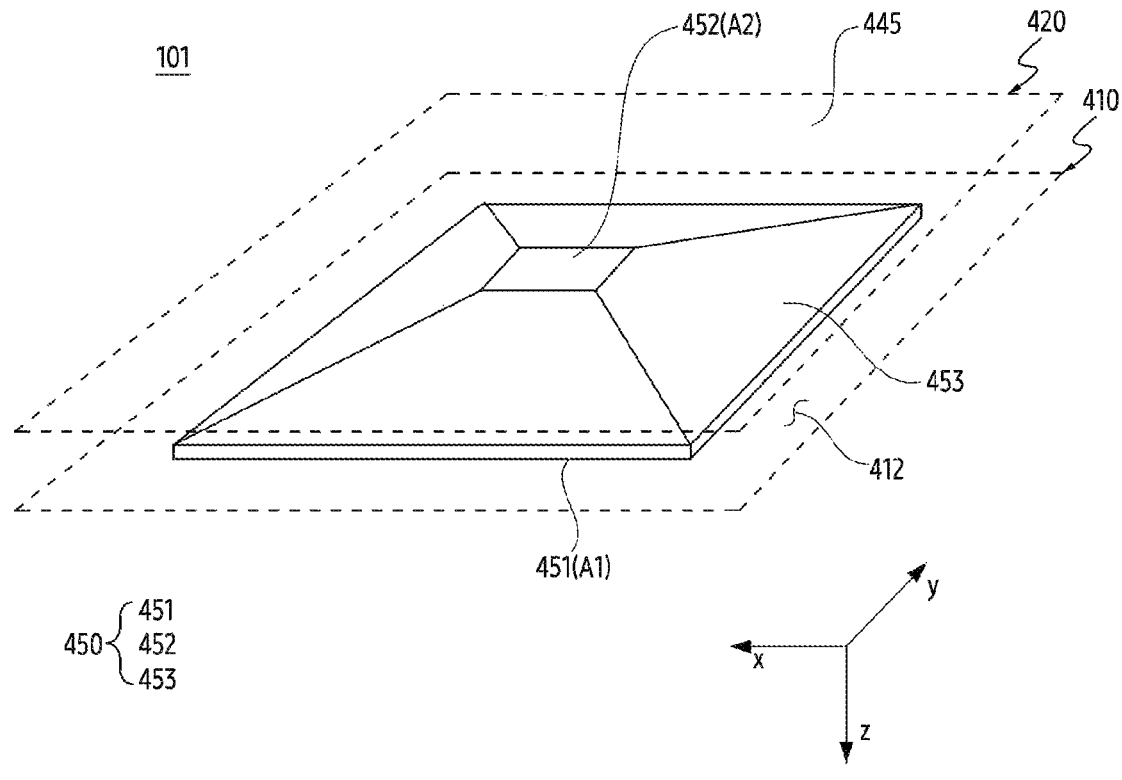
FIGS. 6A, 6B, and 6C illustrates a supporting member of a speaker of an example electronic device.
Figure 6B:
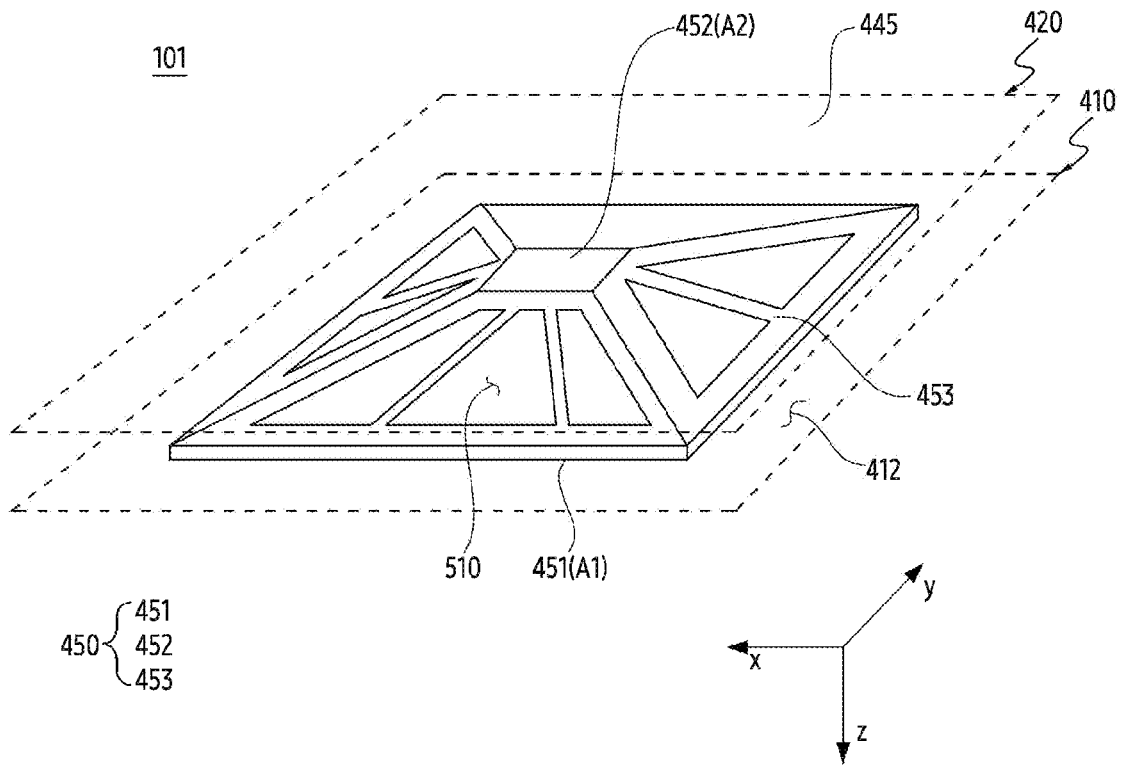
Figure 6C:
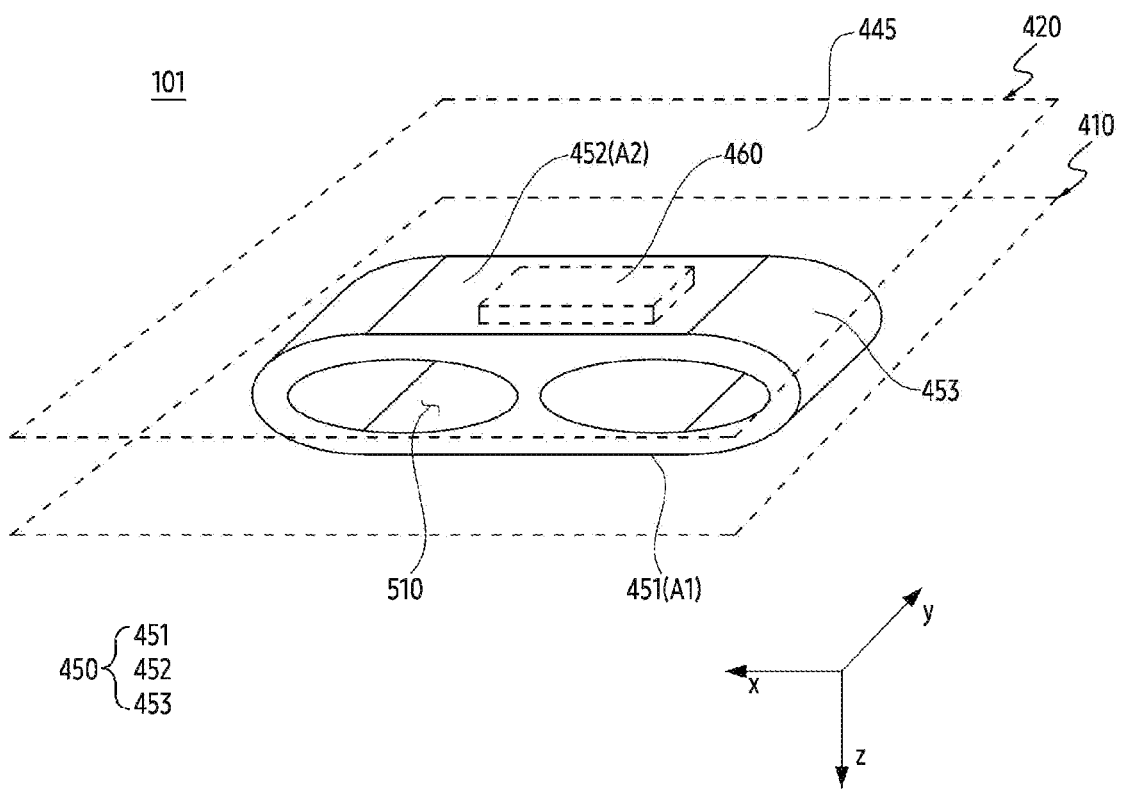

FIGS. 6A, 6B, and 6C illustrate a supporting member of a speaker of an example electronic device.

Referring to FIGS. 6A, 6B, and 6C, the electronic device 101 may include a speaker 410, an enclosure 420, and a supporting member 450. The supporting member 450 may be disposed between the fourth surface 412 of the speaker 410 and the heat dissipation portion 445 of the enclosure 420. The supporting member 450 may include a first portion 451 disposed on the fourth surface 412, a second portion 452 facing the heat dissipation portion 445, and a third portion 453 connecting the first portion 451 and the second portion 452.

According to an embodiment, the first portion 451 may be in contact with the fourth surface 412, and the second portion 452 may be in contact with the heat dissipation portion 445. The area A2 of the second portion 452 in contact with the heat dissipation portion 445 may be less than the area A1 of the first portion 451 in contact with the fourth surface 412 to reduce the heat transferred from the fourth surface 412 through the supporting member 450 to the heat dissipation portion 445, while the audio is output from the speaker 410. For example, the area A1 of the fourth surface 412 in contact with the first portion 451 may be greater than the area A2 of the heat dissipation portion 452 in contact with the second portion 452. Since the area A1 of the first portion 451 in contact with the fourth surface 412 is greater than the area A2 of the second portion 452 in contact with the heat dissipation portion 445, the first portion 451 may serve to reduce vibrations of the speaker 410 when the speaker 410 outputs the audio. Since the area A2 of the second portion 452 in contact with the heat dissipation portion 445 is smaller than the area A1 of the first portion 451 in contact with the fourth surface 412, the second portion 452 may serve to reduce the heat transferred from the fourth surface 412 through the supporting member 450 to the heat dissipation portion 445.

For example, referring to FIGS. 6A and 6B, the supporting member 450 may have a pyramid shape in between the fourth surface 412 of the speaker 410 and the heat dissipation portion 445 of the enclosure 420. As the supporting member 450 has such a pyramid shape, the area A2 of the second portion 452 in contact with the heat dissipation portion 445 may be smaller than the area A1 of the first portion 451 in contact with the fourth surface 412. For example, referring to FIG. 6C, the heat insulating member 460 may be omitted. The supporting member 450 may have a track shape in which the area A2 of the second portion 452 in contact with the heat dissipation portion 445 is smaller than the area A1 of the first portion 451 in contact with the fourth surface 412. The supporting member 450 may increase the size of at least one air gap 510 included in the third portion 453, by at least partially bending the third portion 453 extending from the first portion 451 to the second portion 452. However, the present disclosure is not limited thereto.

Referring back to FIGS. 6A, 6B, and 6C, the second portion 452 of the supporting member 450 may be in contact with the heat dissipation portion 445 of the enclosure 420. The thermal conductivity of the heat dissipation portion 445 may be greater than that of the supporting member 450. Since the thermal conductivity of the supporting member 450 is less than the thermal conductivity of the heat dissipation portion 445, the supporting member 450 may reduce the heat transferred from the fourth surface 412 of the speaker 410 to the heat dissipation portion 445 in contact with the second portion 452 of the supporting member 450.

Referring to FIGS. 6B and 6C, the third portion 453 of the supporting member 450 may include at least one air gap 510 for passing air in the enclosure 420. The at least one air gap 510 may include a plurality of air gaps. Since the third portion 453 includes the plurality of air gaps, the supporting member 450 may transfer at least part of the heat transferred from the fourth surface 412 of the speaker 410 through the supporting member 450 to the heat dissipation portion 445, to air passing through each of the plurality of air gaps. As at least part of the heat transferred to the heat dissipation portion 445 through the supporting member 450 is transferred to the air passing through each of the plurality of air gaps, the supporting member 450 may reduce the heat transferred from the fourth surface 412 to the heat dissipation portion 445.

Referring again to FIGS. 6A, 6B, and 6C, the supporting member 450 may further include rubber. The supporting member 450 may be deformable by the vibrations generated from the speaker 410, when the audio is output from the speaker 410. As the supporting member 450 further includes rubber, the supporting member 450 may have a relatively lower thermal conductivity. Since the supporting member 450 has a relatively lower thermal conductivity, the supporting member 450 may reduce the heat transferred from the fourth surface 412 through the supporting member 450 to the heat dissipation portion 445. Since the supporting member 450 is deformable by the vibrations generated from the speaker 410, the supporting member 450 may reduce possible damage to the speaker 410 and/or the enclosure 420 by the vibrations generated while the speaker 410 outputs the audio.

According to the above-described embodiment, the area A2 of the second portion 452 in contact with the heat dissipation portion 445 of the enclosure 420 is smaller than the area A1 of the first portion 451 in contact with the fourth surface 412 of the speaker 410, and thus, the supporting member 450 may reduce the heat transferred from the fourth surface 412 through the supporting member 450 to the heat dissipation portion 445, when the speaker 410 outputs the audio.

According to the above-described embodiment, an electronic device (e.g., the electronic device 101 of FIG. 1) may include a housing (e.g., the housing 210 of FIG. 2) including a first surface (e.g., the first surface 200A of FIG. 2) on which a display (e.g., the display 201 of FIG. 2) is disposed and a second surface (e.g., the second surface 200B of FIG. 2) opposite to the first surface. The electronic device may include a speaker (e.g., the speaker 410 of FIG. 4A) including a third surface (e.g., the third surface 411 of FIG. 4A) facing the first surface and a fourth surface (e.g., the fourth surface 412 of FIG. 4A) facing the second surface and including a yoke, the speaker being configured to output audio. The electronic device may include an enclosure (e.g., the enclosure 420 of FIG. 4A) configured to surround at least a portion of the speaker, the enclosure including a heat dissipation portion comprising a thermally conductive material (e.g., the heat dissipation portion 445 of FIG. 4A) facing the fourth surface of the speaker and spaced apart from the fourth surface. The electronic device may include a supporting member (e.g., the supporting member 450 of FIG. 4A) disposed between the fourth surface of the speaker and the enclosure, the supporting member including a first portion (e.g., the first portion 451 of FIG. 5) disposed on the fourth surface of the speaker, a second portion (e.g., the second portion 452 of FIG. 5) facing the heat dissipation portion, and a third portion (e.g., the third portion 453 of FIG. 5) connecting the first portion and the second portion. An area (e.g., the area A1 of FIG. 5) of the first portion disposed on the fourth surface may be greater than an area (e.g., the area A2 of FIG. 5) of the second portion facing the heat dissipation portion. According to the above-described embodiment, the electronic device may include the supporting member, thereby reducing vibrations of the speaker and reducing the heat transferred from the fourth surface to the heat dissipation portion, when the audio is output from the speaker. The supporting member may increase an area supporting the fourth surface of the speaker by having the area of the first portion greater than the area of the second portion. Since the area of the second portion is smaller than the area of the first portion, the supporting member may reduce the heat transferred from the fourth surface through the second portion of the supporting member to the heat dissipation portion. The above-mentioned embodiments may have various advantageous effects in addition to the above-mentioned effects.

According to an embodiment, the electronic device may further include a heat insulating member comprising a thermally insulating material (e.g., the heat insulating member 460 of FIG. 4A) disposed between the supporting member and the heat dissipation portion and in contact with the second portion and the heat dissipation portion, so as to reduce the heat transferred from the speaker to the heat dissipation portion while the audio is output. According to the above-described embodiment, the electronic device may include the heat insulating member to reduce the heat transferred from the supporting member to the heat dissipation portion. The above-mentioned embodiments may have various effects including the above-mentioned effects.

According to an embodiment, the rigidity of the supporting member may be greater than that of the insulating member. The heat insulating member may be deformable by vibrations generated from the speaker when the audio is output. According to the above-described embodiment, the supporting member may reduce the vibrations of the speaker when the speaker outputs the audio, as the rigidity of the supporting member is greater than the rigidity of the heat insulating member. The heat insulating member may be deformable to reduce damage to the enclosure including the speaker and/or the heat dissipation portion due to the vibrations of the speaker when the speaker outputs the audio. The above-mentioned embodiments may have various advantageous effects including the above-mentioned effects.

According to an embodiment, an area of the second portion contacting the heat insulating member and facing the heat dissipation portion may be greater than an area (e.g., the area A3 of FIG. 5) of the heat insulating member contacting the heat dissipation portion. According to the above-described embodiment, the heat insulating member may reduce the heat transferred from the second portion through the heat insulating member to the heat dissipation portion, since the area of the heat insulating member is less than the area of the second portion. The above-mentioned embodiments may have various advantageous effects including the above-mentioned effects.

According to an embodiment, the third portion of the supporting member may include at least one air gap (e.g., the at least one air gap 510 of FIG. 5) configured to pass air in the enclosure in order to reduce heat transferred from the first portion to the second portion when the audio is output. According to the above-described embodiment, the third portion of the supporting member may include the at least one air gap to transfer at least part of heat transferred from the first portion to the second portion, to the air. The third portion may reduce the heat transferred from the fourth surface through the supporting member to the heat dissipation portion, by transferring at least part of heat transferred from the first portion to the second portion, to the air passing through the at least one air gap. The above-mentioned embodiments may have various advantageous effects including the above-mentioned effects.

According to an embodiment, the first portion may include an opening (e.g., the opening 520 of FIG. 5) that is in contact with the fourth surface of the speaker and is connected to the at least one air gap. According to the above-described embodiment, the first portion of the supporting member may include the opening to provide an additional space for the air passing through the at least one air gap. The opening may reduce the heat transferred from the fourth surface through the supporting member to the heat dissipation portion, by providing the additional space for the air. The above-mentioned embodiments may have various advantageous effects including the above-mentioned effects.

According to an embodiment, the electronic device may further include a heat dissipation member (e.g., the heat dissipation member 470 of FIG. 4A) including a first region (e.g., the first region 471 of FIG. 4B) disposed between the heat dissipation portion and the second surface and a second region (e.g., the second region 472 of FIG. 4B) extending from the first region, so as to reduce the heat transferred from the heat dissipation portion to the second surface of the housing when the audio is output. According to the above-described embodiment, the electronic device may include the heat dissipation member to reduce the heat transferred from the heat dissipation portion of the enclosure to the second surface of the housing. The above-mentioned embodiments may have various advantageous effects including the above-mentioned effects.

According to an embodiment, the first region may overlap the second portion of the supporting member, when the second surface of the housing is viewed from above. According to the above-described embodiment, the first region of the heat dissipation member may overlap the second portion when the second surface is viewed from above, and thus, at least part of the heat emitted from the second surface may be transferred through the heat dissipation portion. The first region may reduce the heat transferred from the heat dissipation portion to the second surface of the housing, by dispersing the heat transferred from the heat dissipation portion through the second region. The above-mentioned embodiments may have various advantageous effects including the above-mentioned effects.

According to an embodiment, the first portion may be in contact with the fourth surface, and the second portion may be in contact with the heat dissipation portion. An area of the second portion in contact with the heat dissipation portion may be smaller than an area of the first portion in contact with the fourth surface, so as to reduce the heat transferred from the fourth surface through the supporting member to the heat dissipation portion while the audio is output. According to the above-described embodiment, the supporting member may reduce the heat transferred from the fourth surface through the supporting member to the heat dissipation portion, since the area of the second portion in contact with the heat dissipation portion is smaller than the area of the first portion in contact with the fourth surface. The above-mentioned embodiments may have various advantageous effects including the above-mentioned effects.

According to an embodiment, the supporting member may further include rubber, and may be deformable by the vibrations generated from the speaker when the audio is output. According to the above-mentioned embodiment, the supporting member may have a relatively low thermal conductivity due to inclusion of the rubber. The supporting member may be deformable to reduce damage to the speaker and/or the enclosure caused by the vibrations of the speaker when the audio is output from the speaker. The above-mentioned embodiments may have various advantageous effects including the above-mentioned effects.

According to an embodiment, the third portion may be at least partially bent to extend from the first portion to the second portion. According to the above-described embodiment, the third portion may be at least partially bent to extend a path for the heat transferred from the first portion to the second portion. The third portion may reduce the heat transferred from the first portion to the second portion due to extending the path. The above-mentioned embodiments may have various advantageous effects including the above-mentioned effects.

According to an embodiment, the enclosure may further include an audio hole (e.g., the audio hole 431 of FIG. 5) facing the third surface, and a supporting portion (e.g., the supporting portion 432 of FIG. 5) disposed along a periphery of the audio hole and supporting the third surface, so as to provide a path through which the audio of the speaker is output. A thickness (e.g., the thickness d1 of FIG. 5) of the supporting portion may be less than a distance (e.g., the distance d2 of FIG. 5) between the fourth surface and the heat dissipation portion. According to the above-described embodiment, since the distance between the fourth surface and the heat dissipation portion is greater than the thickness of the supporting portion supporting the third surface, the electronic device may provide a space for the supporting member and reduce the heat transferred from the fourth surface to the heat dissipation portion. The above-mentioned embodiments may have various advantageous effects including the above-mentioned effects.

According to an embodiment, the enclosure may further include a resonance space (e.g., the resonance space S of FIG. 5) configured to surround at least a portion of the speaker and resonate the audio output from the speaker. The supporting portion of the enclosure may seal the resonance space. According to the above-described embodiment, the enclosure may include the resonance space to improve sound quality of the audio output from the speaker. The supporting portion may seal the resonance space, thereby preventing foreign substances from flowing into the resonance space from the outside of the enclosure. The above-mentioned embodiments may have various advantageous effects including the above-mentioned effects.

According to an embodiment, the second portion may be in contact with the heat dissipation portion. The thermal conductivity of the heat dissipation portion may be greater than a thermal conductivity of the support. According to the above-described embodiment, the supporting member may have the thermal conductivity of the supporting member lower than the thermal conductivity of the heat dissipation portion in contact with the supporting member, thereby reducing the heat transferred from the fourth surface through the supporting member to the heat dissipation portion. The above-mentioned embodiments may have various advantageous effects including the above-mentioned effects.

According to an embodiment, the heat dissipation portion may include metal. According to the above-mentioned embodiment, the heat dissipation portion may have a relatively higher thermal conductivity due to inclusion of the metal. The heat dissipation portion may include metal to reduce the heat transferred from the heat dissipation portion to the second surface of the housing. The above-mentioned embodiments may have various advantageous effects including the above-mentioned effects.

According to an embodiment, an electronic device may include a housing including a first surface and a second surface opposite to the first surface. The electronic device may include a speaker including a third surface facing the first surface and a fourth surface facing the second surface, the speaker being configured to output audio. The electronic device may include an enclosure configured to surround at least a portion of the speaker, the enclosure including a heat dissipation portion including a metal facing the fourth surface of the speaker and spaced apart from the fourth surface. The electronic device may include a supporting member disposed between the fourth surface of the speaker and the enclosure, the supporting member including a first portion disposed on the fourth surface of the speaker, a second portion facing the heat dissipation portion, and a third portion connecting the first portion and the second portion. An area of the first portion disposed on the fourth surface may be greater than an area of the second portion facing the heat dissipation portion. The third portion of the supporting member may include at least one air gap configured to pass air in the enclosure in order to reduce the heat transferred from the first portion to the second portion, when the audio is output. According to the above-described embodiment, the electronic device may include the supporting member, thereby reducing vibrations of the speaker and reducing the heat transferred from the fourth surface to the heat dissipation portion, when the audio is output from the speaker. The supporting member may have the area of the first portion greater than the area of the second portion, thereby increasing an area supporting the fourth surface of the speaker. Since the area of the second portion is less than the area of the first portion, the supporting member may reduce the heat transferred from the fourth surface through the second portion of the supporting member to the heat dissipation portion. The third portion of the supporting member may include the at least one air gap to transfer at least part of heat transferred from the first portion to the second portion, to the air. The third portion may reduce the heat transferred from the fourth surface through the supporting member to the heat dissipation portion, by transferring at least part of the heat transferred from the first portion to the second portion to the air passing through the at least one air gap. The heat dissipation portion may have a relatively higher thermal conductivity due to including metal. The heat dissipation portion may include the metal to reduce the heat transferred from the heat dissipation portion to the second surface of the housing. The above-mentioned embodiments may have various advantageous effects in addition to the above-mentioned effects.

According to an embodiment, the electronic device may further include a heat insulating member comprising a thermally insulating material disposed between the supporting member and the heat dissipation portion and contacting the second portion and the heat dissipation portion, so as to reduce the heat transferred from the speaker to the heat dissipation portion, when the audio is output. According to the above-described embodiment, the electronic device may include the heat insulating member to reduce the heat transferred from the supporting member to the heat dissipation portion. The above-mentioned embodiments may have various advantageous effects including the above-mentioned effects.

According to an embodiment, the rigidity of the supporting member may be greater than that of the heat insulating member. The heat insulating member may be deformable by vibrations generated from the speaker when the audio is output. According to the above-described embodiment, the supporting member may reduce the vibrations of the speaker when the speaker outputs the audio, since the rigidity of the supporting member is greater than the rigidity of the heat insulating member. The heat insulating member may be deformable to reduce damage to the enclosure including the speaker and/or the heat dissipation portion due to the vibrations of the speaker, while the speaker outputs the audio. The above-mentioned embodiments may have various advantageous effects including the above-mentioned effects.

According to an embodiment, the electronic device may further include a heat dissipation member including a first region disposed between the heat dissipation portion and the second surface, and a second region extending from the first region, so as to reduce the heat transferred from the heat dissipation portion to the second surface of the housing, when the audio is output. According to the above-described embodiment, the electronic device may include the heat dissipation member to reduce the heat transferred from the heat dissipation portion of the enclosure to the second surface of the housing. The above-mentioned embodiments may have various advantageous effects including the above-mentioned effects.

According to an embodiment, the first portion may be in contact with the fourth surface, and the second portion may be in contact with the heat dissipation portion. An area of the second portion in contact with the heat dissipation portion may be smaller than an area of the first portion in contact with the fourth surface, in order to reduce the heat transferred from the fourth surface through the supporting member to the heat dissipation portion, while the audio is output. According to the above-described embodiment, the supporting member may reduce the heat transferred from the fourth surface through the supporting member to the heat dissipation portion, since the area of the second portion in contact with the heat dissipation portion is less than the area of the first portion in contact with the fourth surface. The above-mentioned embodiments may have various advantageous effects including the above-mentioned effects.

According to an embodiment, in order to provide a path through which the audio of the speaker is output, the enclosure may further include an audio hole facing the third surface, and a supporting portion disposed along a periphery of the audio hole and supporting the third surface. A thickness of the supporting portion may be less than a distance between the fourth surface and the heat dissipation portion. According to the above-described embodiment, the distance between the fourth surface and the heat dissipation portion may be greater than the thickness of the supporting portion supporting the third surface, thereby providing a space for the supporting member and reducing the heat transferred from the fourth surface to the heat dissipation portion. The above-mentioned embodiments may have various advantageous effects including the above-mentioned effects.

According to an embodiment, the enclosure may further include a resonance space configured to surround at least a portion of the speaker and resonate the audio output from the speaker. The supporting portion of the enclosure may be configured to seal the resonance space. According to the above-described embodiment, the enclosure may include the resonance space to improve sound quality of the audio output from the speaker. The supporting portion may seal the resonance space to prevent foreign substances from flowing into the resonance space from the outside of the enclosure. The above-mentioned embodiments may have various advantageous effects including the above-mentioned effects.

The electronic device according to various embodiments disclosed herein may be one of various types of electronic devices. The electronic devices may include, for example, a portable communication device (e.g., a smartphone), a computer device, a portable multimedia device, a portable medical device, a camera, a wearable device, or a home appliance. According to an example, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B", "at least one of A and B", "at least one of A or B", "A, B, or C", "at least one of A, B, and C", and "at least one of A, B, or C" may include any one of, or all possible combinations of the items enumerated together in a corresponding one of the phrases. As used herein, such terms as "1st" and "2nd" or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with", "coupled to", "connected with", or "connected to" another element (e.g., a second element), it may mean that the element may be coupled with the other element directly (e.g., wiredly), wirelessly, or via a third element.

As used in connection with various embodiments of the disclosure, the term "module" may include a unit implemented in hardware, software, or firmware, and may be interchangeably used with other terms, for example, "logic", "logic block", "part", or "circuitry". A module may be a single integral component, or a minimum unit or part thereof, adapted to perform one or more functions. For example, according to an example, the module may be implemented in a form of an application-specific integrated circuit (ASIC).

Various embodiments as set forth herein may be implemented as software (e.g., a program 140) including one or more instructions that are stored in a storage medium (e.g., an internal memory 136 or an external memory 138) that is readable by a machine (e.g., an electronic device 101). For example, a processor (e.g., a processor 120 of an electronic device 101) of the machine may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an example, a method according to various embodiments of the disclosure may be included and provided in a computer program product. The computer program product may be traded as a product between a seller and a buyer. The computer program product may be distributed in the form of a machine-readable storage medium (e.g., a compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments of the disclosure, each component (e.g., a module or a program) of the above-described components may include a single entity or multiple entities, and some of the multiple entities may be separately disposed in different components. According to various embodiments of the disclosure, one or more of the above-described components may be omitted, or one or more other components may be added. Alternatively or additionally, a plurality of components (e.g., modules or programs) may be integrated into a single component. In such a case, according to various embodiments of the disclosure, the integrated component may still perform one or more functions of each of the plurality of components in the same or similar manner as they are performed by a corresponding one of the plurality of components before the integration. According to various embodiments of the disclosure, operations performed by the module, the program, or another component may be carried out sequentially, in parallel, repeatedly, or heuristically, or one or more of the operations may be executed in a different order or omitted, or one or more other operations may be added.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents. It will also be understood that any of the embodiment(s) described herein may be used in conjunction with any other embodiment(s) described herein.

What is claimed is:

1. An electronic device comprising:
a speaker configured to output audio;
an enclosure enclosing at least a portion of the speaker, the enclosure including a heat dissipation portion thermally connected to a rear plate of the electronic device, wherein the rear plate is thermally conductive;
a supporting member contacted with a rear side of the speaker to support the speaker, wherein the supporting member is thermally conductive; and
a heat insulating member disposed between the supporting member and the heat dissipation portion of the enclosure and contacted with both the supporting member and the heat dissipation portion of the enclosure,
wherein an area of a first portion of the supporting member contacted with the rear side of the speaker is wider than an area of a second portion of the supporting member contacted with the heat insulating member such that a rate of heat flow through the heat insulating member is reduced and an amount of heat transferred to the heat dissipation portion of the enclosure via the heat insulating member is limited.

2. The electronic device of claim 1, wherein the heat insulating member is elastic, and
wherein the heat insulating member is compressed by the supporting member and the heat dissipation portion.

3. The electronic device of claim 2, wherein the supporting member includes a third portion connecting the first portion of the supporting member and the second portion of the supporting member, the third portion having curved shape.

4. The electronic device of claim 3, wherein a thickness of the third portion of the supporting member is thinner than at least one of the first portion of the supporting member and the second portion of the supporting member.

5. The electronic device of claim 1, wherein the first, second, and third portion of the supporting member defines at least a portion of an air gap configured for increasing a surface area of the supporting member contacted with air.

6. The electronic device of claim 5,
wherein the first portion of the supporting member includes an opening that allows the rear side of the speaker to be thermally connected with the at least one air gap.

7. The electronic device of claim 1, wherein the supporting member has a frustum shape.

8. The electronic device of claim 1,
wherein the area of the second portion of the supporting member contacting the heat insulating member and facing the heat dissipation portion is wider than an area of the heat insulating member contacting the heat dissipation portion.

9. The electronic device of claim 1 further comprising:
a heat dissipation member, wherein the heat dissipation member includes:
a first region disposed between the heat dissipation portion and the rear plate of the electronic device; and
a second region extending from the first region and spaced apart from the enclosure,
wherein the second region reduces heat transferred from the heat dissipation portion to the rear plate of the electronic device by dissipating at least a portion of heat transferred from the heat dissipation portion to the first region.

10. The electronic device of claim 9,
wherein the first region overlaps the second portion of the supporting member.

11. The electronic device of claim 1,
wherein the supporting member further includes rubber, and
wherein the rubber is deformable by vibration generated from the speaker when the audio is output.

12. The electronic device of claim 1,
wherein the enclosure further includes:
an audio hole portion defining an audio hole facing the front side of the speaker to provide a path for the audio output from the speaker; and
a supporting portion disposed along a periphery of the audio hole portion and supporting the front side of the speaker; and
wherein a thickness of the supporting portion is thinner than a distance between the rear side of the speaker and the heat dissipation portion.

13. The electronic device of claim 12,
wherein the enclosure further includes a resonance space surrounding at least a portion of the speaker configured to resonate the audio output from the speaker, and
wherein, the supporting portion of the enclosure seals the resonance space.

14. The electronic device of claim 1,
wherein a thermal conductivity of the heat dissipation portion is greater than a thermal conductivity of the supporting member.

15. The electronic device of claim 1,
wherein the heat dissipation portion includes metal.

16. An electronic device comprising:
a speaker configured to output audio;
an enclosure surrounding at least a portion of the speaker and including a heat dissipation portion facing a rear side of the speaker, the heat dissipation portion being spaced apart from the rear side of the speaker and including metal; and
a supporting member disposed between the rear side of the speaker and the heat dissipation portion of the enclosure, wherein the supporting member includes:
a first portion disposed on the rear side of the speaker,
a second portion facing the heat dissipation portion, and
a third portion connecting the first portion and the second portion,
wherein an area of the first portion of the supporting member disposed on the rear side of the speaker is wider than an area of the second portion of the supporting member facing the heat dissipation portion such that a rate of heat flow to the heat dissipation portion through the supporting member is reduced, and
wherein the first, second, and third portions of the supporting member define at least a portion of an air gap configured for increasing a surface area of the supporting member contacted with air.

17. The electronic device of claim 16, wherein the supporting member has a frustum shape.

18. The electronic device of claim 16 further comprising:
a heat insulating member comprising a thermally insulating material disposed between the supporting member and the heat dissipation portion to reduce heat transferred from the speaker to the heat dissipation portion when the audio is output,
wherein the heat insulating member is contacted with both the second portion of the supporting member and the heat dissipation portion.

19. The electronic device of claim 18,
wherein a rigidity of the supporting member is greater than a rigidity of the heat insulating member, and
wherein the heat insulating member is deformable by vibration generated from the speaker when the audio is output.

20. The electronic device of claim 16 further comprising:
a heat dissipation member, wherein the heat dissipation member includes:
a first region disposed between the heat dissipation portion and the rear plate of the electronic device; and
a second region extending from the first region and spaced apart from the enclosure,
wherein the second region reduces heat transferred from the heat dissipation portion to the rear plate of the electronic device by dissipating at least a portion of heat transferred from the heat dissipation portion to the first region.

*    *    *    *    *